US012038611B2

United States Patent
Jiang et al.

(10) Patent No.: US 12,038,611 B2
(45) Date of Patent: Jul. 16, 2024

(54) OPTICAL SPOT SIZE CONVERTER AND A METHOD OF MAKING SUCH

(71) Applicant: CORNING INCORPORATED, Corning, NY (US)

(72) Inventors: Wei Jiang, Vestal, NY (US); Dan Trung Nguyen, Painted Post, NY (US); Daniel Aloysius Nolan, Corning, NY (US); Aramais Robert Zakharian, Painted Post, NY (US)

(73) Assignee: CORNING INCORPORATED, Corning, NY (US)

( * ) Notice: Subject to any disclaimer, the term of this patent is extended or adjusted under 35 U.S.C. 154(b) by 229 days.

(21) Appl. No.: 17/612,471

(22) PCT Filed: May 19, 2020

(86) PCT No.: PCT/US2020/033511
§ 371 (c)(1),
(2) Date: Nov. 18, 2021

(87) PCT Pub. No.: WO2020/242812
PCT Pub. Date: Dec. 3, 2020

(65) Prior Publication Data
US 2022/0260784 A1 Aug. 18, 2022

Related U.S. Application Data

(60) Provisional application No. 62/853,985, filed on May 29, 2019.

(51) Int. Cl.
*G02B 6/30* (2006.01)
*G03F 7/00* (2006.01)

(52) U.S. Cl.
CPC .......... *G02B 6/305* (2013.01); *G03F 7/0005* (2013.01); *G03F 7/0035* (2013.01)

(58) Field of Classification Search
CPC ..................................................... G02B 6/305
See application file for complete search history.

(56) References Cited

U.S. PATENT DOCUMENTS 7,317,853 B2   1/2008   Laurent-Lund et al.
7,551,826 B2   6/2009   Taylor
(Continued)

FOREIGN PATENT DOCUMENTS

CN    1212529 C    7/2005
CN    106461866 A  2/2017
(Continued)

OTHER PUBLICATIONS

Han Kyunghun, et, al, "Double slot fiber-to-chip coupler using direct strip-slot mode coupling", Optical Fiber Communications Conference and Exhibition (OFC), OSA, Mar. 2017, pp. 1-3.
(Continued)

*Primary Examiner* — Charlie Y Peng
(74) *Attorney, Agent, or Firm* — Daniel J. Greenhalgh

(57) ABSTRACT

A method of making a spot size converter comprising a multi-tip waveguide comprising a first and a second waveguide portions, the method comprising the steps of: coating a multilayer wafer comprising a waveguide material layer with a resist material; exposing the coated resist material to a deep UV beam or an electron beam; developing resist material to form an partial waveguide pattern within the resist material; transferring the partial waveguide pattern to the waveguide material layer, forming an initial waveguide; placing a second layer of resist material over the initial waveguide; patterning a tapered gap region shape in the second layer of resist material by exposing the second layer of resist material to a deep UV beam or an electron beam; and transferring the tapered gap region shape to the wave- (Continued)

guide material layer of the initial waveguide to form a tapered gap region inside the initial waveguide.

22 Claims, 10 Drawing Sheets

(56) References Cited

U.S. PATENT DOCUMENTS

| | | | |
|---|---|---|---|
| 7,664,352 B1 | 2/2010 | Okayama | |
| 8,285,092 B2 | 10/2012 | Deki et al. | |
| 8,488,923 B2 | 7/2013 | Na et al. | |
| 8,488,932 B2 | 7/2013 | Bennett et al. | |
| 9,036,969 B2 | 5/2015 | Kwon et al. | |
| 9,128,240 B2 | 9/2015 | Hatori et al. | |
| 9,195,001 B2 | 11/2015 | Hatori et al. | |
| 10,598,854 B2* | 3/2020 | Ishikura | G02B 6/2793 |
| 2004/0071403 A1 | 4/2004 | Lipson et al. | |
| 2005/0205969 A1* | 9/2005 | Ono | H01L 29/66833 257/E21.21 |
| 2006/0204175 A1* | 9/2006 | Laurent-Lund | G02B 6/305 385/129 |
| 2012/0076465 A1 | 3/2012 | Chen et al. | |
| 2013/0259425 A1 | 10/2013 | Okayama | |
| 2013/0259426 A1* | 10/2013 | Li | G02B 6/02019 385/123 |
| 2015/0286002 A1 | 10/2015 | Frumkin et al. | |
| 2016/0062038 A1 | 3/2016 | Oka | |
| 2016/0124148 A1* | 5/2016 | Matsumoto | G02B 6/1228 385/28 |
| 2018/0348454 A1 | 12/2018 | Lu et al. | |

FOREIGN PATENT DOCUMENTS

| | | | | |
|---|---|---|---|---|
| EP | 2442165 A1 | | 4/2012 | |
| EP | 3159719 A1 | | 4/2017 | |
| JP | 2004133446 A | * | 4/2004 | G02B 6/1228 |
| JP | 2012-118402 A | | 6/2012 | |
| KR | 10-0678979 B1 | | 2/2007 | |
| WO | 2016/008114 A1 | | 1/2016 | |

OTHER PUBLICATIONS

International Search Report and Written Opinion of the International Searching Authority; PCT/US2020/033511; dated Aug. 4, 2020; 12 pages; European Patent Office.

International Search Report and Written Opinion of the International Searching Authority; PCT/US2020/033542; dated Aug. 4, 2020; 12 pages; European Patent Office.

Yan Liu et al., "Low-Loss Coupler Between Fiber and Waveguide Based on Silicon-On-Insulator Slot Waveguides", Applied Optics, Optical Society of America, vol. 46, No. 32, Nov. 2007, pp. 7858-7861.

A. Sure, et al., "Fabrication and characterization of three-dimensional silicon tapers," Optics Express, vol. 11 No.26, Dec. 2003, pp. 3555-3561.

D. Taillaert et al., "Grating Couplers for Coupling between Optical Fibers and Nanophotonic Waveguides," Japanese J. of Appl. Phys., vol. 45, No. 08, Aug. 2006, pp. 6071-6077.

G. Roelkens, et al., "High efficiency Silicon-on Insulator grating coupler based on a poly-Silicon overlay", Optics Express, vol. 14, Nov. 2006, pp. 11622-11630.

J. Cardenas et al., "High Coupling Efficiency Etched Facet Tapers in Silicon Waveguides". IEEE Photonics Tech. Lett, vol. 26, 2380 (2014).

L. Englert, et al., "Control of ionization processes in high band gap materials via tailored femtosecond pulses." Optics Express vol. 15 No. 26, Dec. 2007, pp. 17855-17862.

L. Vivien et al., "2-D taper for low loss coupling between polarization-insensitive micro-waveguides and single-mode optical fibers," IEEE J. Lightw. Technol., vol. 21, 2429 (2003).

M.K. Bhuyan, et al. "Single-shot high aspect ratio bulk nanostructuring of fused silica using chirp-controlled ultrafast laser Bessel beams" Applied Physics Letters, vol. 104, No. 02, Jan. 2014, pp. 021107.

Maegami "Spot-size converter with a SiO2 spacer layer between tapered Si and SiON waveguides for fiber-to-chip coupling", Optics Express vol. 23, Aug. 2015, pp. 21287-21295.

N. Fang, et al., "Three-Dimensional Tapered Spot-Size Converter Based on (111) Silicon-on-Insulator", IEEE Photonics Technology Letters, vol. 21, No. 12, Jun. 2009, pp. 820-822.

Tao, S.H., et al., "Improving coupling efficiency of fiber-waveguide coupling with a double-tip coupler", Optics Express, vol. 16, No. 25, Dec. 2008.

Vivien, et al., "Design, Realization, and Characterization of 3-D Taper for Fiber/Micro-Waveguide Coupling", IEEE Journal of Selected Topics in Quantum Electronics, vol. 12, No. 6, Nov. 2006, pp. 1354-1358.

W. S. Zaoui, et al., "Bridging the gap between optical fibers and silicon photonic integrated circuits", Optics Express, vol. 22, No. 2, Jan. 2014, pp. 1277-1286.

Wang qian, et al. "Y-branch spot-size converter for a buried silica waveguide with large index difference", Applied Optics, vol. 43, Issue 16, Jun. 2004, pp. 3315-3318.

* cited by examiner $W_2=W_1=t=150nm$  
MFD ~ 1μm $W_2=W_1=t=100nm$  
MFD ~ 3-4μm $W_2 min=W_1 min=t=40nm$  
MFD ~ 8-9μm

OPTICAL SPOT SIZE CONVERTER AND A METHOD OF MAKING SUCH

CROSS-REFERENCE TO RELATED APPLICATIONS

This application claims the benefit of priority under 35 U.S.C. § 371 of International Application No. PCT/US2020/033511, filed on May 19, 2020, which claims the benefit of priority under 35 U.S.C § 119 of U.S. Provisional Application Ser. No. 62/853,985 filed on May 29, 2019, the content of which are relied upon and incorporated herein by reference in their entirety.

BACKGROUND

Technical Field

The disclosure relates generally to an optical spot-size converter between an optical fiber and an optical waveguide, and more particularly to an optical spot-size converter comprising a first waveguide portion and a second waveguide portion connected to a third waveguide portion, where the distance between first and the second waveguide portions gradually decreases while the width of the first and second waveguide portions gradually increases, and which may be used, for example, for coupling a single-mode fiber to an optical silicon strip waveguide of a silicon-based photonic integrated circuit (Photonic Integrated Circuit, PIC) chip on a silicon-on-insulator (SOI) platform.

Background

With the development of high-speed and large-capacity optical communications technologies, a key technology in an optical integrated device is to implement effective coupling between a waveguide and an optical fiber. For example, the optical waveguide may be a silicon strip waveguide for a silicon-based PIC chip.

An optical signal needs to be coupled from a single-mode optical fiber to the silicon waveguide in the silicon-based PIC chip. However, the width of a cross section of the silicon waveguide is at the submicron level, and the diameter of a common single-mode optical fiber is at the several microns level. That is, the size of the cross section of the silicon waveguide is much smaller than the core diameter of the common single-mode optical fiber. In addition, a silicon waveguide core layer in the silicon-based PIC chip has a relatively high refractive index. Mismatches between spot sizes and effective refractive indexes of the silicon waveguide and the common single-mode optical fiber, and the mode field diameter (MFD) mismatch cause large coupling loss between the silicon-based PIC chip and the optical.

For example, a typical silicon strip waveguide is about 200-220 nm (0.2 to 0.22 microns) thick and about and 400-500 nm (0.4 to 0.5 microns) wide, while the core diameter of a typical single-mode fiber is about 8 microns. This size mismatch results in a large mismatch between MFDs of the single-mode fiber and the silicon strip waveguide. For example, a typical standard single-mode fiber has a MFD of about 10 µm, and a nanophotonic silicon strip waveguide has a MFD of less than 1 µm.

Due to this mismatch, direct end-to-end coupling between a standard single-mode fiber and a nanophotonic silicon strip waveguide (MFD<1 µm) results in a coupling loss of greater than 20 dB.

End face coupling is a method for reducing the coupling loss between the silicon-based PIC chip and the optical fiber. In end face coupling, a spot size converter (SSC) is designed and manufactured at an edge of the silicon-based PIC chip. A mode field in the SSC is coupled to a mode field in an external single-mode optical fiber, and the size of the optical mode spot in the SSC can be changed as it propagates from one end of the SSC to its other end. However, typical end-to-end SSCs that minimize coupling loss between a silicon-based PIC chip and a single-mode optical fiber are difficult and expensive to manufacture.

More specifically, because of sub-micrometer features needed by conventional SSCs and the need to control the feature size within tens of nanometers, conventional optical deep UV lithography is considered not to be suitable for pattern definition of these SSC waveguides structures. Because of the need for high resolution, e-beam lithography is the most-used technique for research purposes and prototyping. This e-beam lithography process, in which structures are written directly into photoresist with a focused electron beam, can create extremely small features. However, because everything is written in a serial way, the typical e-beam process is typically very slow and, therefore, expensive and not suitable for large volume manufacturing. Furthermore, conventional single tip SSC waveguides provide an expanded MFD (i.e., maximum MFD) of only about 3 or 4 microns.

No admission is made that any reference cited herein constitutes prior art. Applicant expressly reserves the right to challenge the accuracy and pertinency of any cited documents.

SUMMARY

One embodiment of the disclosure relates to a method of making a spot size converter comprising a multi-tip waveguide comprising first and second waveguide portions separated by a tapered gap region Gr, the method comprising the steps of:

(a) coating a multilayer wafer comprising a waveguide material layer with a photo-resist material or an electron beam resist material;

(b) exposing the coated resist material to a deep UV beam or an electron beam;

(c) developing resist material to form at least a partial waveguide pattern within the resist material;

(d) transferring the partial waveguide pattern to the waveguide material layer to form an initial waveguide;

(e) placing a second layer of resist material over the initial waveguide;

(f) patterning a tapered gap region shape in the second layer of resist material by exposing the second layer of resist material to a deep UV beam or an electron beam; and (g) transferring the tapered gap region shape to the waveguide material layer of the initial waveguide to form the tapered gap region Gr inside the initial waveguide, thereby forming a multi-tip waveguide with the first and the second waveguide portions separated by the tapered gap region Gr.

According to some embodiments the maximum width Gmax between the second end of the first waveguide portion (301) and the second end of the second waveguide portion (302) is greater than 0.2 µm and less than 0.48 µm; and the waveguide has a refractive index between 2 and 4 at 1550 nm wavelength.

According to some embodiments a method of making a spot size converter comprises a multi-tip waveguide comprising first and second waveguide portions separated by a gap region Gr, the method comprising the steps of:
(a) coating a multilayer wafer with a photo-resist material;
(b) exposing the coated photo-resist material to a deep UV beam through a first mask;
(c) developing the photo-resist material to form a partial waveguide pattern within the photo-resist material;
(d) transferring the partial waveguide pattern to a waveguide material layer of the wafer to form an initial waveguide;
(e) placing a second layer of photo-resist material over the initial waveguide;
(f) patterning a tapered gap region shape in the second layer of the photo-resist material by exposing the second layer of the photo-resist material to a deep UV beam with the second mask situated over the second slayer of photo-resist material;
(g) utilizing the tapered gap region shape in the second layer of the photo-resist material to form a tapered gap region Gr inside the initial waveguide, thereby forming a multi-tip waveguide with the first and the second waveguide portions separated by a gap region Gr.

A method of making a spot size converter comprising the steps of:
(A) depositing a photo-resist material on a multilayer wafer and forming a first resist layer on the multilayer wafer;
(B) patterning the photo-resist material of the first resist layer to create a first transfer pattern by:
(a) placing a first mask over the first resist layer and then exposing the first resist layer to a deep UV light beam;
(b) subsequently removing unwanted portions of the photo-resist material that were exposed to deep UV light, thereby forming the desired shape in the photo-resist material and creating the first transfer pattern;
(C) removing waveguide material from the multilayer wafer, except for the waveguide material portions that are situated under the first transfer pattern, to form an initial waveguide;
(D) applying a second layer of photo-resist material over the initial waveguide;
(E) patterning the second layer of the photo-resist material to create a second transfer pattern by exposing the second layer of the photo-resist material to a deep UV light beam while masking a portion of the second resist layer with a second mask;
(F) utilizing the second transfer pattern to form a tapered gap region Gr inside the initial waveguide by removing unwanted portions of the waveguide material from the initial waveguide, thereby forming a multi-tip waveguide, the multi-tip waveguide comprising first and second waveguide portions separated by a gap region Gr.

According to some embodiments the gap region Gr has a trapezoidal cross-section.

Advantageously, the spot size converter (SSC) with a multi-tip waveguide disclosed herein can be manufactured with the waveguide having small tip widths (W1, W2) of less than 100 microns, and the manufacturing of such SSCs does not require expensive high-resolution lithography.

Additional features and advantages will be set forth in the detailed description which follows, and in part will be readily apparent to those skilled in the art from the description or recognized by practicing the embodiments as described in the written description and claims hereof, as well as the appended drawings.

It is to be understood that both the foregoing general description and the following detailed description are merely exemplary and are intended to provide an overview or framework to understand the nature and character of the claims.

The accompanying drawings are included to provide a further understanding and are incorporated in and constitute a part of this specification. The drawings illustrate one or more embodiment(s), and together with the description serve to explain principles and operation of the various embodiments.

DETAILED DESCRIPTION

Definitions

The "relative refractive index percent" is defined as $$\Delta\% = 100 \times [n^2 - n_{REF}^2]/n^2,$$

where n is the refractive index of the material in the region of interest, and $n_{REF}$ is the refractive index of the reference material. The relative refractive index percent is defined at 1550 nm unless otherwise specified. In one aspect, the reference index $n_{REF}$ is for silica glass with refractive index of about 1.45 at 1550 nm. As used herein, the relative refractive index percent (also referred to herein as the relative refractive index) is represented by $\Delta$ and its values are given in units of "%", unless otherwise specified. In cases where the refractive index of a region is less than the reference index $n_{REF}$, the relative index percent is negative and the region is referred to depressed region or depressed-index. In cases where the refractive index of a region is greater than the reference index $n_{REF}$, the relative index percent is positive and the region can be said to be raised or to have a positive index.

For example, relative refractive index percent of a silicon waveguide (relative to a pure silica glass) is $$\Delta\% = 100 \times [n^2 - n_{REF}^2)]/2n^2 = 100 \times (3.48^2 + 1.45^2)/2 \times 3.48^2 = 82.6\%.$$

An "updopant" is herein considered to be a dopant which has a propensity to raise the refractive index relative to pure undoped $SiO_2$. A "downdopant" is herein considered to be a dopant which has a propensity to lower the refractive index relative to pure undoped $SiO_2$. An updopant may be present in a region of an optical fiber having a negative relative refractive index when accompanied by one or more other dopants which are not updopants. Likewise, one or more other dopants which are not updopants may be present in a region of an optical fiber having a positive relative refractive index. A downdopant may be present in a region of an optical fiber having a positive relative refractive index when accompanied by one or more other dopants which are not downdopants.

Coupling efficiency between two waveguides having mode field diameters $MFD_1$ and $MFD_2$ is defined as:

$$\alpha = 4 \times (MFD_1^2 \times MFD_2^2)/(MFD_1^2 + MFD_2^2)^2$$

Coupling loss between two waveguides having mode field diameters $MFD_1$ and $MFD_2$ is defined as:

$$\eta = 1 - \alpha$$

When calculated in dB, coupling loss $\eta$ (dB) is calculated as $$10 \log 10(\eta)$$

Various embodiments will be further clarified by the following examples.

Example 1A

Figure 1A:
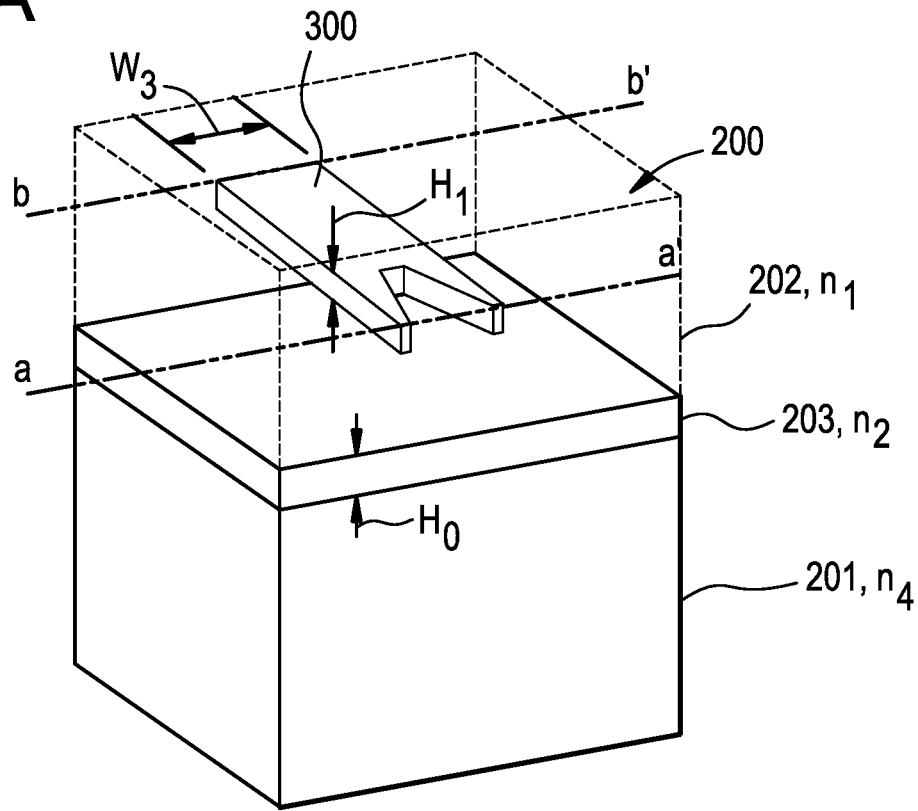
FIG. 1A is a schematic diagram of a spot size converter according to an embodiment of the present invention.

FIG. 1A is a schematic diagram of a spot size converter (SSC) according to an embodiment of the present invention. The spot size converter 200 shown in FIG. 1A includes: (a) a substrate layer 201 (e.g., silicon, or $Y_2O_3$ transparent ceramic (refractive index n=1.88+/−5% at 1550 nm); (b) a first coverage layer 202 disposed above the substrate layer 201, where the first coverage layer comprises a first material (e.g., glass such as silicon dioxide $SiO_2$); (c) an optional intermediate layer 203 disposed between the substrate layer 201 and the first coverage layer 202, where the intermediate layer comprises a second material (e.g., silicon dioxide, doped silica glass, or $Y_2O_3$ doped ceramic; (d) and a SSC waveguide 300 disposed inside the first coverage layer. The waveguide 300 of FIG. 1A is at least partially enclosed by the first coverage layer 202. The first and the second materials may be, for example, silica-based glasses (e.g., pure silica, or doped silica), and may have the same, or similar composition. According to some embodiments the waveguide 300 is a silica waveguide. The substrate layer 201 comprises a fourth material (e.g., silicon), and according to some embodiments the composition of the third and fourth materials may be the same or substantially the same.

For example, the substrate layer 201 may be silica. The first coverage layer 202 may be pure silica $SiO_2$, the waveguide may be silicon or silicon nitride, and an optional layer may be $Y_2O_3$ doped ceramic.

Example 1B

Figure 1B:
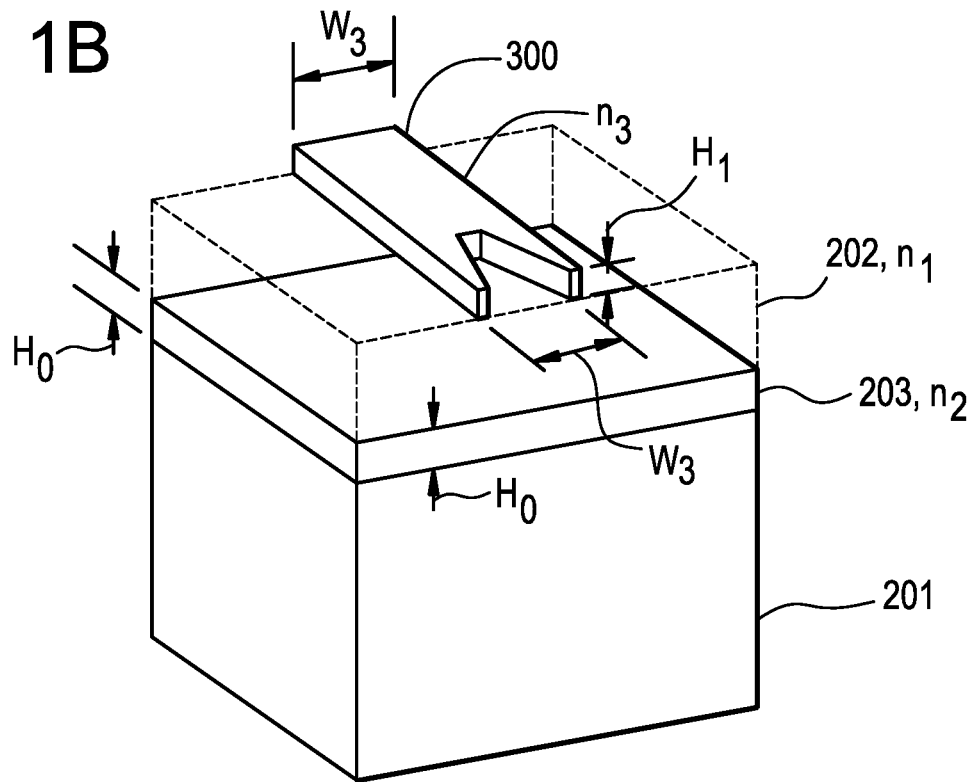
FIG. 1B is a schematic diagram of a spot size converter according to an embodiment of the present invention.

FIG. 1B is a schematic diagram of a spot size converter according to an embodiment of the present invention. The spot size converter 200 shown in FIG. 1A includes: a substrate layer 201 (e.g. silicon); (b) a first coverage layer 202 disposed above the substrate layer 201, where the first coverage layer comprises a first material; (c) an optional intermediate layer 203 disposed between the substrate layer 201 and the first coverage layer 202, where the intermediate layer comprises a second material; and a SSC waveguide 300 disposed over the first coverage layer. The substrate layer 201 comprises a fourth material (e.g., silicon, or $Y_2O_3$ transparent ceramic (refractive index 1.88+/−5% at 1550 nm)), and according to some embodiments the composition of the third and fourth materials may be the same or substantially the same. For example, the substrate layer 201 may be silicon. The first coverage layer 202 may be pure silica $SiO_2$, the waveguide 300 may be silicon or silicon nitride, and the optional layer may be $Y_2O_3$ doped ceramic. Waveguide 300.

Figure 2:
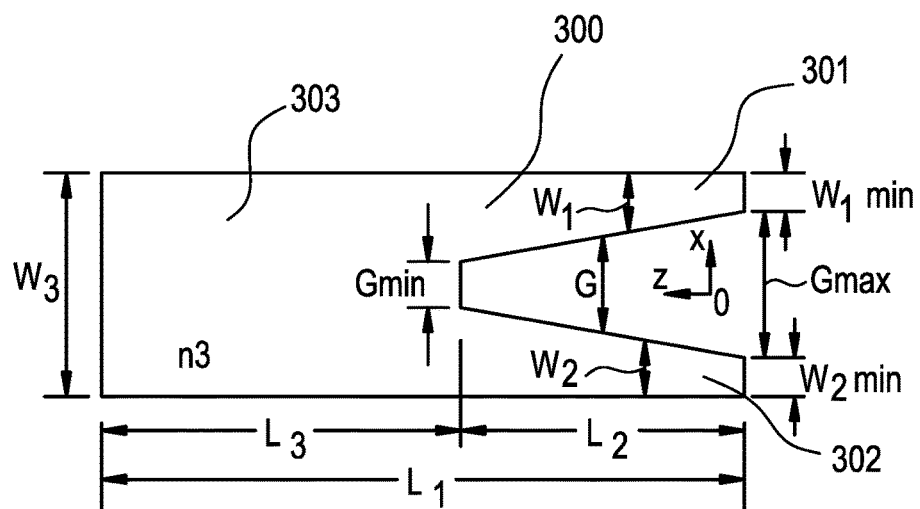
FIG. 2 is a planar diagram of a waveguide of a spot size converter according to an embodiment of the present invention.

The waveguide 300 is preferably symmetrical along a principal axis and comprises a third material. The waveguide 300 has multiple tips (e.g., 2). One embodiment of multi-tip waveguide 300 is shown in FIG. 2. The principal axis is indicated by a dotted line. Specifically, the exemplary embodiment of the waveguide 300 shown in FIG. 2 includes a first waveguide portion 301 (terminating in a first tip), a second waveguide portion 302 (terminating in a second tip), and a third waveguide portion 303. The first and the second waveguide portions are tapered—i.e., their widths change along their lengths. The first end of the third waveguide portion 303 is connected to the first end of the first waveguide portion 301 and the first end of the second waveguide portion 302. According to at least some embodiments, the gap region Gr (also referred herein as a gap, Gr) between the first and the second waveguide portions is tapered. That is, the gap region Gr has a V shape cross-section, or a trapezoidal cross-section in the x-z plane—i.e., the distance G (width of the gap region Gr) between the waveguide portions 301 and 302 is tapered and thus is not uniform. According to some embodiments, the tapered gap region Gr has a taper of length Lt such that 300 microns<Lt<2000 microns. In the embodiments shown in FIGS. 1A, 1B, and FIG. 2, widths W1, W2 of the first and the second waveguide portions 301, 302, gradually increase along the first direction (direction of the principal axis) towards the first end of the third waveguide portion 303, and the distance G (i.e., the width G of the gap Gr), between the first waveguide portion 301 and the second waveguide portion 302 gradually decreases from the second end of the first or second waveguide portions to the first end of the first waveguide portion 301. That is, the width G of the gap Gr, in a second direction, between the first waveguide portion 301 and the second waveguide portion 302 gradually decreases towards the first end of the third waveguide portion 303. The second direction is perpendicular to the first direction. FIG. 2 further shows an Oxy coordinate system, where in this embodiment the first waveguide portion 301 and the second waveguide portion 302 are symmetrical with respect to the y axis, and the width G of the gap region the is measured along the x axis.

Figure 3A:
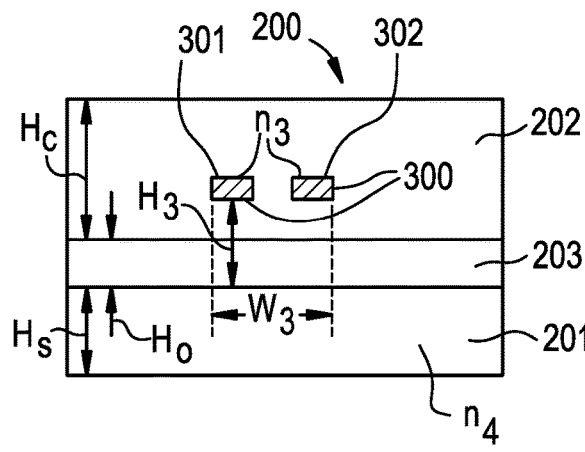
FIG. 3A is a schematic an end face diagram of a cross section in which a-a' of a spot size converter is located according to one embodiment.
Figure 3B:
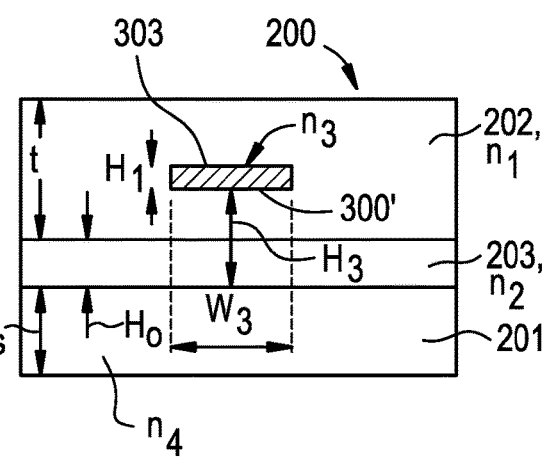
FIG. 3B is a schematic an end face diagram of a cross section in which b-b' of a spot size converter is located according to the embodiment corresponding to FIG. 3A.

FIG. 3A illustrates schematically a cross section in which a-a' in FIG. 2 is located. It illustrates that thickness of the first waveguide portion 301 and thickness of the second waveguide portion 302 are H1, minimum widths of the first waveguide portion 301 and the second waveguide portion 302 are W1 min, W2 min, and distances from the bottom of the first waveguide portion 301 and bottom of the second waveguide portion 302 to top of the substrate layer 201 or the bottom of the intermediate layer are H3. In the exemplary embodiment of FIG. 2 the widths W1 and W2 are equal (W1=W2). In addition, it is assumed that the plane of the cross section in which a-a' is located is an x-y plane. FIG. 3B illustrates schematically a cross section in which b-b' in FIG. 2 is located. FIG. 3B illustrates that the thickness of the third waveguide portion 303 is also H1, and the width of the third waveguide portion 303 is W3. It is noted, that in this embodiment W3 is equal, or is substantially equal, to the sum of W1, W2 and G. For example, in the embodiment shown in FIG. 2, W3=W1+W2+G. Thus, in this embodiment, W3=W1min+W2min+Gmax.

Preferably, in order to provide more efficient coupling, at a 1550 nm wavelength, the absolute value of the difference between the refractive index of the second material and the refractive index of the first material is preferably not greater than 0.1 (i.e., |n2−n1|≤0.1), and/or the difference between the refractive index of the third material and the refractive index of the first material is not less than 0.5 (e.g., n3−n1>0.5). For example, |n2−n1| may be 0, 0.02, 0.05, 0.075, 0.09, or therebetween. Also, for example, at a wavelength of 1550 nm, n3−n1 may be 1.5, 1.8, 2, 2.5, or therebetween. The third material may be of silicon or silicon nitride—i.e., the waveguide 300 may be made of silicon or silicon nitride. The fourth material (i.e., the substrate layer material) may have refractive index n4 at the 1550 nm wavelength. In some embodiments n4=n3 (e.g., both the waveguide 300 and the substrate may be made of silica). In the embodiments described herein n4>n2, for example n4−n2 is >0.5, and in some embodiments n4−n2>1. For example, if the second material is silica-based glass (e.g., n2 between 1.8≥n2>1.45), and the fourth material is silicon such that 4≥n4≥3.5, then n4−n2 may be between about 1.5 and about 3.

Thus, according to some embodiments, the spot size converter 200 includes a first waveguide portion 301, a second waveguide portion 302, and a third waveguide portion 303 that together may form a tapered gap within the waveguide 300. Preferably, as shown in FIG. 2, the gap Gr within the waveguide 300 has a trapezoidal cross-section or V-shaped cross-section in the x-z plane. The spot size converter can be used to implement spot size conversion between an optical fiber (e.g., a single mode fiber) and an optical waveguide (e. g., silicon strip waveguide), and the coupling loss between the optical fiber and the optical waveguide can be reduced by using the spot size converter.

Figure 4:
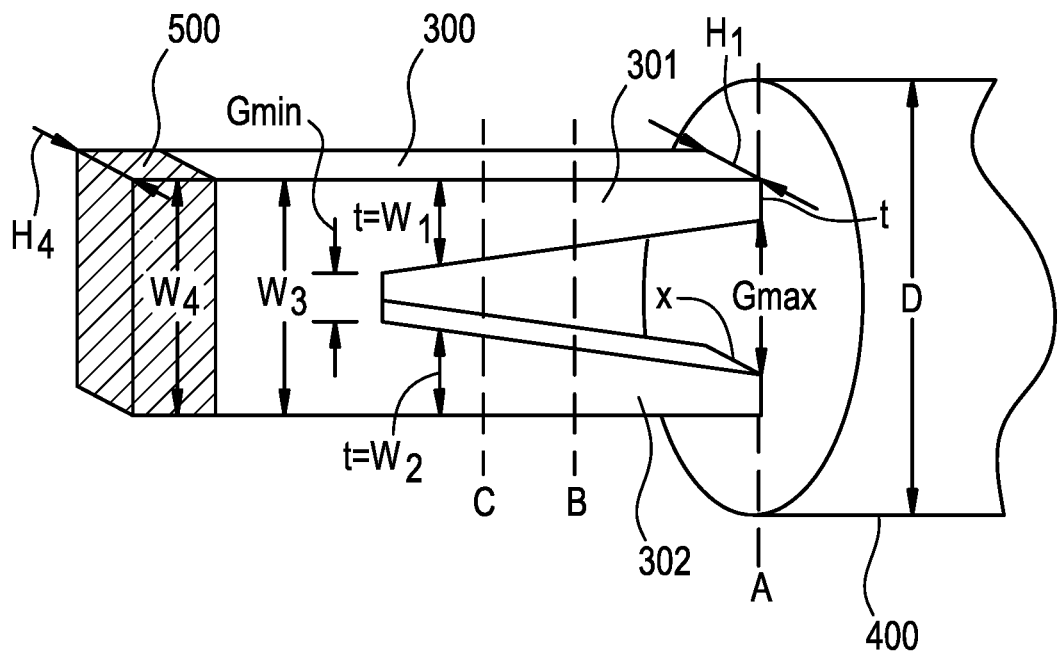
FIG. 4 illustrates schematically a waveguide of FIG. 2 coupled to an optical fiber and an optical waveguide.

In this embodiment, the spot size converter 200 can be added and connected to an end of the optical waveguide. Specifically, the spot size converter can be connected to the optical waveguide 500 by using the second end of the third waveguide portion 303. For example, as shown in FIG. 4, the second end of the third waveguide portion 303 may be directly connected to the optical waveguide 500, and the second end of the two optical waveguide portions 301, 302 may be connected or coupled to an optical fiber 400. Other ways of connecting the spot size converter 200 to the optical waveguide 500 may also be utilized.

In the embodiment of FIG. 4, the cross section of the optical waveguide 500 is rectangular, the width of the optical waveguide 500 is W4, and the height is H4. The optical waveguide 500 may be, for example, an optical silicon strip waveguide 500'. In some embodiments the optical silicon strip waveguide 500' may have a width W4 of about 0.4 microns to about 0.5 microns, and a height H4 of about 0.2 microns to about 0.22 microns.

It should be noted that in the embodiments described herein, a cross section refers to a section perpendicular to a length direction. Alternatively, it may be understood that a cross section is a section perpendicular to the first direction.

FIG. 2 further shows an Oxz coordinate system. It may be understood that the first direction is a positive direction of a z axis. In addition, the widths W1, W2 of the first and second waveguide portions 301, 302 gradually increase along the positive direction of the z axis. Preferably, the edges of the first waveguide portion 301 and the second waveguide portion 302 are straight.

Preferably, as shown in FIG. 2, the cross-sectional shape of the third waveguide portion 303 is rectangular and the width of the third waveguide portion at the first end of the third waveguide portion 303 is equal to the width at the second end of the third waveguide portion 303. In FIG. 2 embodiment the width of the waveguide portion 303 is constant or substantially constant (i.e., it does not wary by more than 5%, and preferably no more than 2% of its maximum width).

In addition, it is assumed that the length of the waveguide 300 is L1, the lengths of the waveguide portions 301, 302 are L2, and the length of the third waveguide portion 303 is L3. It is assumed that the widths of the first waveguide portion 301 and the second waveguide portion 302 are W1 and W2, and the width of the second end of the third waveguide portion 303 is W3. It is assumed that the thickness of the first waveguide portion 301, the thickness of the second waveguide portion 302, and the thickness of the third waveguide portion 303 are all H1. For example, in some embodiments, 0.2 microns≤H1≤0.22 microns. For example, in some embodiments, H1 is between 0.2 microns and 0.5 microns (e.g., 0.2 to 0.3 microns).

It is assumed that the distance between the bottom of waveguide 300 and the top of substrate layer 201 is H3. Preferably H3>2 micron, and in some embodiments H3≥3 micron (e.g., 2 microns≤H1≤10 microns, 3 microns≤H1≤10 microns, or 3 microns≤H1≤6 microns). For example, in some embodiments, H1 is between 0.2 microns and 0.5 microns (e.g., 0.2 to 0.3 microns), and H3 is ≤5 microns. In some embodiments, 2 microns≤H3≤10 microns, 3 microns≤H3≤10 microns, or 3 microns≤H3≤6 microns. In some embodiments H1≤5 microns. For example, in some embodiments, 2 microns≤H3≤4 microns, or 2 microns≤H3≤3.5 microns. In some embodiments, H1 is between 0.2 microns and 0.5 microns (e.g., 0.2 to 0.3 microns), and H3 is less than 10 microns. In some embodiments, H1 is between 0.2 microns and 0.5 microns (e.g., 0.2 to 0.3 microns), and H3 is less than 6 or 5 microns. In some embodiments, H1 is between 0.2 microns and 0.5 microns (e.g., 0.2 to 0.3 microns), and H3 is between 2 and 4 microns.

It may be understood that in this embodiment, a length is a size in the z-axis direction of coordinate axes, and the width is a size in the x-axis direction of the coordinate axes. Correspondingly, thickness is a size in the y-axis direction of the coordinate axes (that is, an outward direction in FIG. 2).

Exemplary ranges of the foregoing parameters may be as follows: H3>2 μm (e.g., between 2.5 μm and 3.5 μm), 0.1<H1≤300 nm (and preferably 200-250 nm), 100 μm<L1 (e.g., 100 μm<L1≤5000 μm, μm 100<L1≤2000 μm, or for example 1000 μm, or 500 μm), 200<L2≤2000 μm (e.g., 200 to 1500 μm, L2<L1, L3>0 μm (e.g., 200 μm≤L3≤500 μm), the waveguide tips having the widths 10 nm<W1 min≤100 nm and 10 nm≤W2min<100 nm (e.g. 10 nm to 40 nm), and 200 nm≤W3≤500 nm (e.g. 400 nm≤W3≤500 nm). Typical tip widths W1min, W2min at the second ends (tips) of the waveguide portions 301, 302 may be about 30 nm to about 40 nm, but may be smaller (e.g., 15 nm, 20 nm or 25 nm), or greater (for example 45 nm, 50 nm, 60 nm, 70 nm, 80 mm, 90 nm, 100 nm, or therebetween). In some embodiments, the thickness $H_S$ of the substrate layer 201 is about 600 to 700 μm, the thickness Hc of the first coverage layer 202 is about 2 μm to about 10 μm (e.g., about 4 μm to 10 μm for the embodiments shown in FIG. 1A, and 2 μm to 5 μm for the embodiments shown in FIG. 1B), and the thickness HO of the optional intermediate layer 203 (if the layer is present) is greater than about 8 μm (e.g., 10 to 400 μm).

In addition, the distance (Gmin) between the first end of the first waveguide portion 301 and the first end of the second waveguide portion 302 may be 90 to 150 microns, for example 90 to 110 microns, preferably 95 to 105 microns, or 95 to 100 microns. In addition, the distance (Gmax) between the second end of the first waveguide portion 301 and the second end of the second waveguide portion 302 may be 200 nm to 480 nm (e.g., 350 nm to 460 nm, 375 nm to 460 nm, 375 nm to 460 nm, or 400 nm to 450 nm). For example, the distance Gmax (i.e., the maximum width of the gap region Gr) may be 220 nm, 320 nm, 350 nm, 400 nm, 425 nm, or 450 nm, 460 nm, or therebetween.

Optionally, in the spot size converter 200 shown in FIGS. 1A and 1B, the material of the substrate layer 201 may be silicon, the first material may be silicon dioxide, the second material may be silicon dioxide or another material, and the third material may be silicon or silicon nitride.

In this embodiment the substrate layer 201 is used to support the waveguide 300. The first coverage layer 202 is used to limit the propagation of an optical mode to the waveguide 300. The optional intermediate layer 203 may be also used to limit the propagation of an optical mode to the waveguide 300, so that that the optical mode propagated through the waveguide 300 is not coupled into the substrate layer 201.

The mode expansion provided by the waveguide 300 is based on utilization of the two tapered waveguide portions 301, 302 to form an expanding optical mode with a larger mode width (larger MFD) that will propagate through the single mode fiber (e.g., SMF-28® optical fiber available from Corning Incorporated, of Corning NY). MFD of the waveguide 300 is expanded by separating the two waveguide portions 301, 302 by a tapered gap region Gr, thus a waveguide 300 with two legs and with two small tips. The larger the separation Gmax, the larger the MFD of the waveguide 300 at the second end of the waveguide portions 301, 302 situated adjacent to or near the optical fiber). The waveguide 300 thus converts the small mode field diameter MFD from the optical waveguide 500 to a large size mode field diameter (MFD) of single mode fiber 400 by employing two waveguide portions 301, 302.

According to some embodiments, the spot size converter 200 comprises a waveguide 300 that is structured to provide coupling loss of <2 dB when coupled to a single mode fiber and has a mode field diameter (MFD) at 1550 nm, such that the mode field diameter MFD≥7 microns. According to some embodiments the waveguide 300 is structured to provide coupling loss of <1.5 dB and has MFD that is ≥7 microns at a wavelength of 1550 nm. According to some embodiments, the waveguide 300 is structured to provide coupling loss of <1 dB (when coupled to a single mode fiber, and the MFD≥7 microns at 1550 nm. According to some embodiments, the waveguide 300 is structured to provide coupling loss of <1 dB, and 7.5≤MFD≤10 microns. According to some embodiments, the waveguide 300 is structured to provide coupling loss of between 0.2 dB and 1 dB, and 7.5 microns≤MFD≤10 microns. According to some embodiments, the waveguide is structured to provide coupling loss of between 0.2 dB and 0.5 dB, and 7.5 microns≤MFD≤10 microns at 1550 nm.

FIG. 4 illustrates schematically a waveguide 300 of the spot size converter 200 situated between the optical fiber 400 and an optical waveguide 500. It may be understood that for the waveguide 300 shown in FIGS. 1A, 1B and FIG. 2, the width W3 of the second end of the third waveguide portion 303 may be equal to the width W4 of the optical waveguide 500, that is, it is preferable that W3 be about the same as W4, and even more preferable that W3=W4. The thickness H1 of the third waveguide portion 303 may be equal to the thickness H4 of the optical waveguide 500, that is, H1=H4.

More specifically, one end of the waveguide 300 is coupled to optical fiber 400, and the other end of the waveguide 300 is coupled to optical waveguide 500. In this way when an output optical signal from the optical fiber 400 (e.g., a single mode fiber) is input to the spot size converter 200 through the second ends of the waveguide portions 301, 302 of the waveguide 300, optical energy propagating through the waveguide 300 may be distributed between the first waveguide portion 301 (1st leg of waveguide 300) and the second waveguide portion 302 (second leg of 300). Then, the optical energy may be coupled into the third waveguide portion 303, and the optical signal is then coupled into the optical waveguide 500.

Similarly, when an output optical signal of the optical waveguide 500 is provided to the spot size converter 200 by coupling the optical waveguide 500 to the third waveguide portion 303, the optical signal propagates through the third waveguide portion 303 and may be then provided to the optical fiber by the first waveguide portion 301 and the second waveguide portion 302 of the waveguide 300, by forming an optical field that is between the first waveguide portion 301 and the second waveguide portion 302.

Figure 5A:
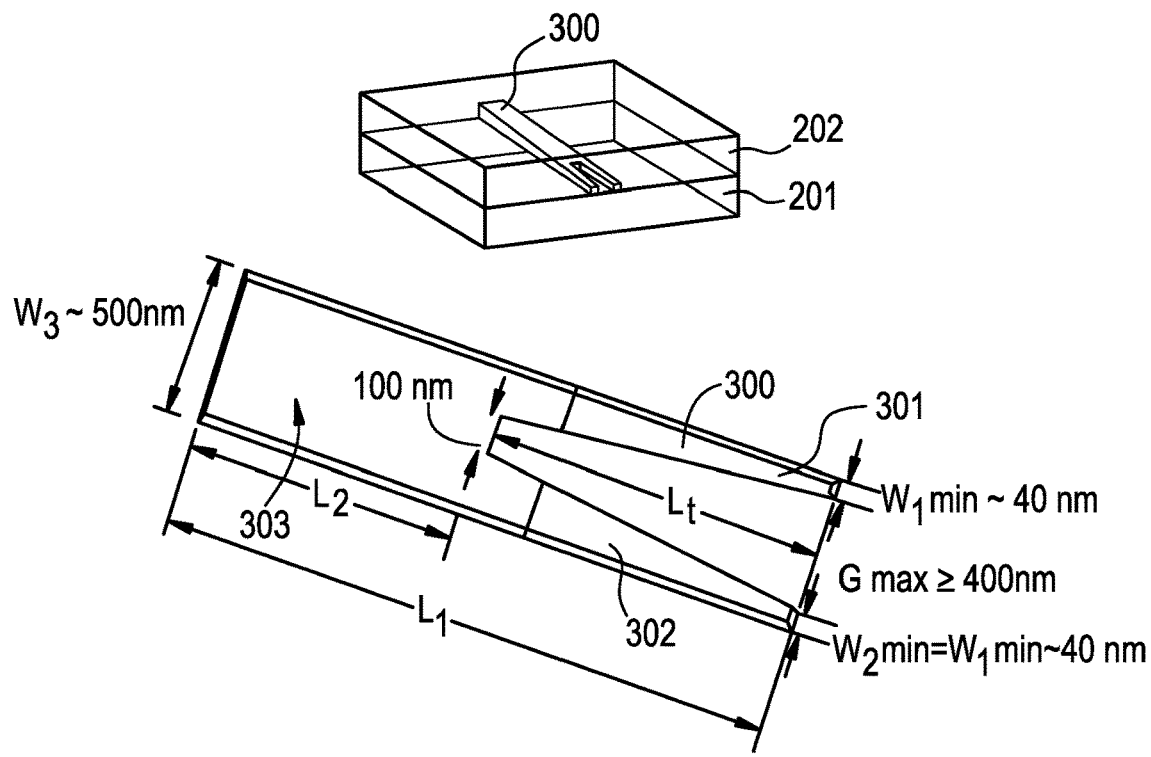
FIG. 5A illustrates one exemplary embodiment of the double tip waveguide 300.

FIG. 5A illustrates one embodiment of the exemplary waveguide 300. In this embodiment the waveguide 300 has the following parameters: W3=500 nm; W1=W2=t; W1 min=W2min=40 nm, L1=2000 μm, L2=1000 μm; H1=220 nm; Gmin=100 nm; Gmax=420 nm. This exemplary embodiment of the waveguide 300 is made of silicon.

Figure 5B:
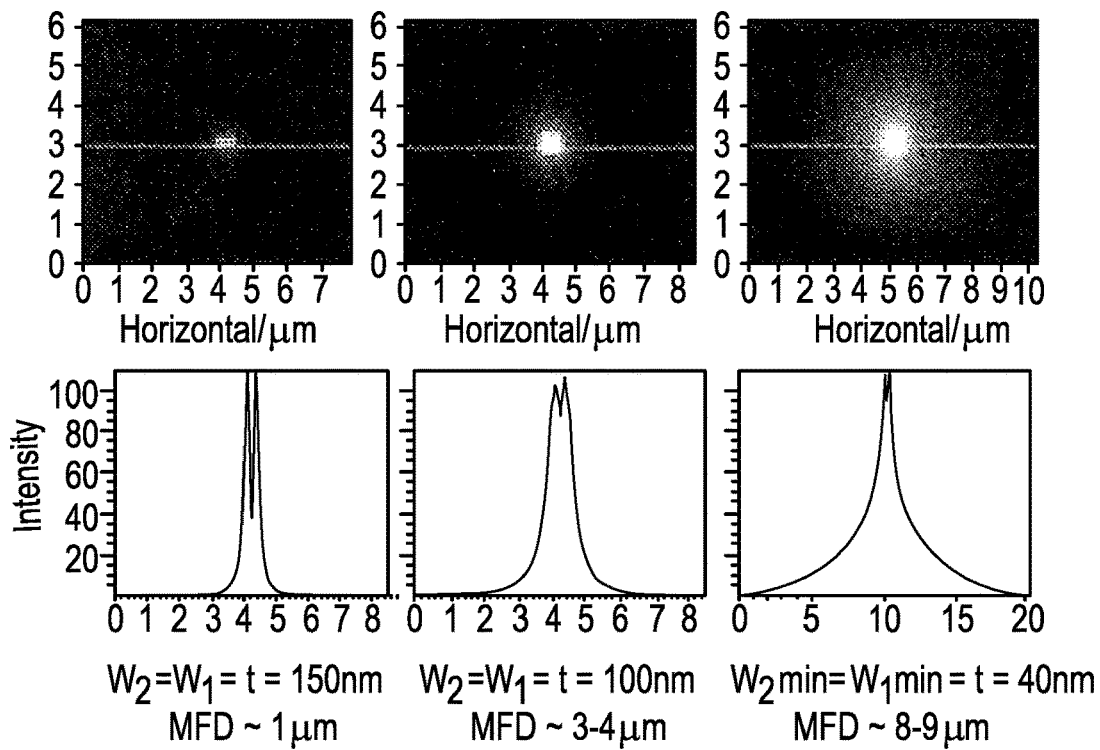
FIG. 5B illustrates simulated optical mode expansion of the spot size in one embodiment of waveguide of FIG. 5A, where the mode expansion is due to due to a tapering of gap region inside the input section of the waveguide.

FIG. 5B illustrates simulated mode expansion in the exemplary waveguide 300 of FIG. 5A. FIG. 5B illustrates the optical mode expansion (which corresponds to the MFD expansion) within this waveguide 300. FIG. 5B illustrates that at the second end of the waveguide portions 301, 302 (i.e., at the tips of these waveguides, location A shown in FIG. 4, where t=W1min=W2min=40 nm) the MFD of the waveguide 300 is about 8-9 microns. This is also a typical MFD for a single mode fiber 400. Accordingly, the waveguide 300 can be advantageously coupled to a single mode fiber 400 with a minimum coupling loss. In contrast, a typical optical spot-size converter with a single-tip tapered waveguide achieves MFD of only 2-3 microns, and thus its connection to a typical single mode fiber results in a much higher loss.

FIG. 5B also illustrates that as the optical modes travel through the waveguide 300, they are expanding in diameter (i.e., MFD of the waveguide expands). For example, at a location B (see FIG. 4) where in this embodiment the width W1=W2=100 nm, the MFD of the waveguide 300 is about 3-4 microns, and at a location C (closer to the front end of the waveguide portions 301, 302) where the waveguide widths W1=W2 is 150 microns, the MFD of the waveguide 300 is about 1 micron. At the second end of the waveguide 300, (where W3=500 nm) the MFD may be even smaller (e.g., 0.8 or 0.9 microns).

The optical mode expansion within the waveguide 300 occurs due to tapering of the width G of the gap region Gr inside the input section of the waveguide 300 (i.e., the section facing the optical fiber 400). More specifically, the tapering of the widths of the waveguide portions 301, 302 result in a tapered gap region of width G between the first and the second waveguide portions. In some embodiments, the width W3 is between 400 nm and 500 nm, while the width G of the tapered gap region Gr changes from a minimum width Gmin of about 100 nm (e.g., Gmin of 90 nm, 95 nm, 100 nm, 110 nm, or 120 nm) to a maximum width Gmax that is larger than 200 nm. For example, in some embodiments, Gmin is about 100 nm or less and Gmax>300 nm, and in some embodiments Gmax>350 nm. In some embodiments Gmax>400 nm. In some embodiments, 500 nm>Gmax>300 nm. In some embodiments, 500 nm>Gmax>350 nm. In some embodiments 500 nm>Gmax>400 nm. These waveguide dimensions (or widths), can be achieved via a relatively low-resolution complementary metal-oxide semiconductor (CMOS) deep-ultra-violet photo-lithography (DUVL) process described below. In contrast, typical commercial spot size converters utilize a single-tip waveguide (where the waveguide is tapered with taper width decreasing from 500 nm down to a tip width of a few tens of nanometers and manufacturing of such single tip waveguides to the required specification is very difficult to make with the lower resolution CMOS DUVL process. Thus, manufacturing such single tip tapered waveguides requires a high-resolution lithographic process, making them more expensive to produce.

Furthermore, the embodiments of the waveguide 300 have double-tips which helps to achieve larger/stronger MFD expansion (to 5 microns or more, e.g., 6 to 10 μm) than that achieved by conventional tapered single-tip spot size converter waveguides, thus advantageously enabling better (higher) fiber-to-chip coupling efficiency relative to that typically achieved by conventional tapered single-tip waveguides. More specifically, our modeling analysis showed that the MFD provided by the exemplary embodiments of the waveguides 300 to a typical single mode fiber 400 is almost twice as large as that which is provided by a single-tip spot size converter waveguide with the same size tip width (e.g., tip width of 40 microns).

Furthermore, efficient low loss coupling between large MFD double-tip spot size converter waveguides 300 and a single mode optical fiber (MFD~8 to 10 μm) can be done with much looser misalignment tolerances than those required when coupling a conventional single tip tapered spot size converter waveguide to the same optical fiber.

For example, when the tip of a single mode optical fiber is not lensed (a lensed fiber is manufactured by creating a lens at the end of the fiber, which is often done in order to enable better coupling between the fiber and the spot size converter waveguide), the misalignment tolerances when coupling double-tip spot size converter waveguides 300 to such single mode optical fibers (MFD~8 to 10 μm) are 5 to 15 times looser than the required maximum tolerances for coupling a conventional single tip tapered spot size converter waveguide to the same single mode optical fiber. Also, for example, the misalignment tolerances when coupling double-tip spot size converter waveguides 300 to typical (not lensed) single mode optical fibers (fiber MFD~8 to 10 μm) are still 2 to 3 times looser than the required maximum tolerances allocated for coupling of conventional single tip tapered spot size converter waveguides to lensed single mode fibers optical fibers. (Lensed single mode fibers optical fibers are single mode optical fibers that have been modified to have a lensed fiber tip having MFD of about 2.5 to 4 μm, which is done to improve the coupling loss between the optical fiber and a conventional single tip tapered spot size converter waveguide). Accordingly, the coupling process between waveguide 300 and a single mode fiber is less time consuming and less expensive compared to the coupling of a conventional spot size converter SSC with a single tip tapered waveguide to the same or similar optical fiber.

Furthermore, because MFD in a double-tip waveguide 300 can be expanded to match that of a single mode fiber, direct coupling of waveguide 300 to single mode fibers 400 can be achieved with low loss and without additional structures. For example, waveguides 300 are "single stage" waveguides, and dual stage waveguide spot size converter (SSC) structures (i.e., structures made of overlapping waveguides situated on top one another) are not needed for spot size converter (SSC) 200 that is used for coupling to a single mode fiber.

Figure 6:
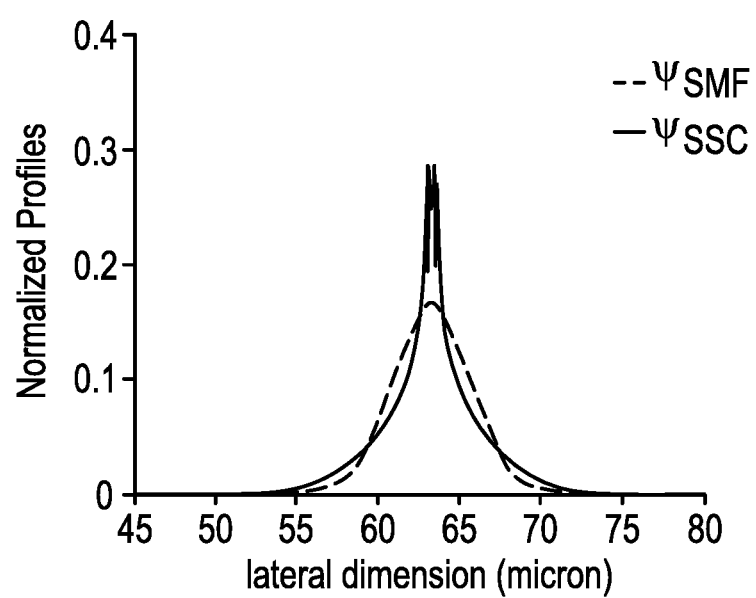
FIG. 6 shows mode profiles ($\psi_{SMF}(r)$ and $\psi_{SSC}(r)$) of an exemplary single mode fiber of FIG. 4, and that of input section (fiber facing section) of the optical waveguide of FIGS. 2, and 5A.

FIG. 6 illustrates normalized optical power profiles vs. lateral dimension (microns) at the end of the waveguide 300 adjacent to the second end of the waveguide portions 301, 302 (solid line), and that of the single mode optical fiber 400 (dashed line). More specifically, FIG. 6 illustrates mode profiles $\psi_{SMF}(r)$ of SMF-28® fiber and $\psi_{SSC}(r)$ of double tip SSC waveguide 300 with tip widths t=W1min=W2min=40 nm (normalized in power $\int \psi(r)r dr=1$). As shown in FIG. 6, most of the optical power is situated within a spot of about 10 micron width that is centered at a lateral position of about 62.5 microns. A typical single mode fiber has an uncoated fiber diameter (i.e., cladding diameter) of about 125 microns. Thus, in this embodiment, the center of the fiber core is situated at a lateral position of 62.5 microns, and as shown in FIG. 6, most power provided by the waveguide 300 to the optical fiber 400 is coupled to the fiber's core. For the optical waveguide 300 coupled to a single mode fiber 400, a coupling coefficient between the waveguide 300 and the single mode fiber 400 of about 95% was calculated by integration of the overlap of the two normalized optical power profiles (i.e., by integrating the overlap of the two normalized powers).

Thus, according to one embodiment, an apparatus for optical transmission comprises the spot size converter 200 described above, which includes an optical waveguide 300. According to some embodiments, the spot size converter 200 is configured to couple an optical signal to the optical waveguide 500 wherein the optical signal is input from an optical fiber 400. According to some embodiments, the spot size converter 200 is connected to the optical waveguide 500 by using the second end of the third waveguide portion 303, and a width of the second end of the third waveguide portion is equal to the width W4 of the optical waveguide 500.

It may be understood that in this embodiment, the waveguide 300 may be formed by using either electron-beam lithography (EBL), or a CMOS compatible process with deep UV lithography (DUVL)). Preferably, the waveguide 300 can be made by removal of the tapered region inside the input section of waveguide by utilizing a relatively low-resolution CMOS-compatible fabrication technique to create the tapered gap Gr between the two waveguide portions 301, 302 of the waveguide 300 (see Process 2, below). Utilization of CMOS-compatible fabrication techniques to manufacture waveguides 300 is advantageous because it can result in production of less expensive spot size converters 200.

As shown in FIG. 5B and described above, the greater the width Gmax of the large end of the taper Gr (which results in the smaller is smaller tip width), the larger the mode expansion that can be achieved, and therefore the better the coupling of the waveguide 300 to the optical fiber 400.

In contrast, a conventional SSC (spot size converter) has a tapered waveguide with a single tip, and a taper size of a typical single tip waveguide decreases from about 500 nm down to the tip of about 100 nm. Single tip SSC waveguides with a smaller tip size (e. g., between 10 nm and 90 nm) cannot be made with a conventional CMOS DUVL SSC manufacturing process, because conventional SMOS DUVL technology has relatively low lithography resolution. Furthermore, conventional single tip SSC waveguides have a tip size of about 100 nm, and provide an expanded MFD (i.e., maximum MFD) of only 3 or 4 microns. Making single tip SSC waveguides with a smaller tip size requires high resolution lithography, and such SSC waveguides are very expensive to manufacture.

According to one embodiment, the waveguide 300 can also be fabricated on a standard SOI (silicon-on-isolator) wafer by DUVL or EBL and anisotropic plasma dry etching to define the inner taper region forming the tapered gap Gr and the double tips of the waveguide portions 301, 302. Furthermore, the waveguide 300 may also be formed by using a photoetching technology.

Once the waveguide 300 is manufactured, of oxide layer (e.g., silicon dioxide, SiO$_2$) may be deposited over the waveguide 300 by PECVD (plasma-enhanced chemical vapor deposition). The first coverage layer 202 is situated directly next to the waveguide 300 and functions like a cladding layer supporting and containing the (signal) light propagation within the waveguide 300. The material of the coverage layer 202 (cladding material) has an index of refraction that is less than the index of refraction of the material of the waveguide 300 (core material).

Waveguide 300 is advantageously suitable for coupling an SW waveguide such as waveguide 500 and single mode fiber 400 due to a tapered gap Gr inside the input section of 300 waveguide. This tapered gap is created, for example, by lithography-based fabrication techniques. More importantly, the waveguide 300 has multiple tips (e.g., double-tips) that can provide large expansion for MFD (maximum MFD≥8 microns) and further enables low loss coupling to a single mode fiber 400 without an extra stage or additional waveguide structure(s).

The spot size converter (SSC) 200 described herein can be fabricated by a CMOS-compatible process based on DUVL (deep UV lithography), or EBL. FIGS. 7A-7E illustrate two exemplary embodiments of processes for fabrication of multi-tip spot size converters 200. These methods create a tapered region Gr inside the input section of waveguide 300, for example preferably using two exemplary CMOS-compatible process illustrated in FIGS. 7A and 7B (e.g., single-step Si etching), or a two-step (Si) etching embodiment illustrated in FIGS. 7C-7E. According to the embodiments described herein the waveguides 300 and the spot size converters (SSC) 200 described herein can be manufactured by the using commercial CMOS-compatible processes.

A deep UV lithographic process (DUVL) utilizes a deep UV beam, with wavelength not greater than 300 nm, e.g., less than 260 nm, for example 150 nm to 255 nm, or 200 nm to 255 nm. For example, the illumination wavelength for DUVL may be 248 nm, 246 nm, 193 nm, or 157 nm. The masks utilized in the DUVL process may be made of chrome or aluminum and the exposure time used in the DUVL process may be, for example, less than 10 min, and preferably 3 minutes or less (e.g., 1 sec-3 min).

Figure 7A:
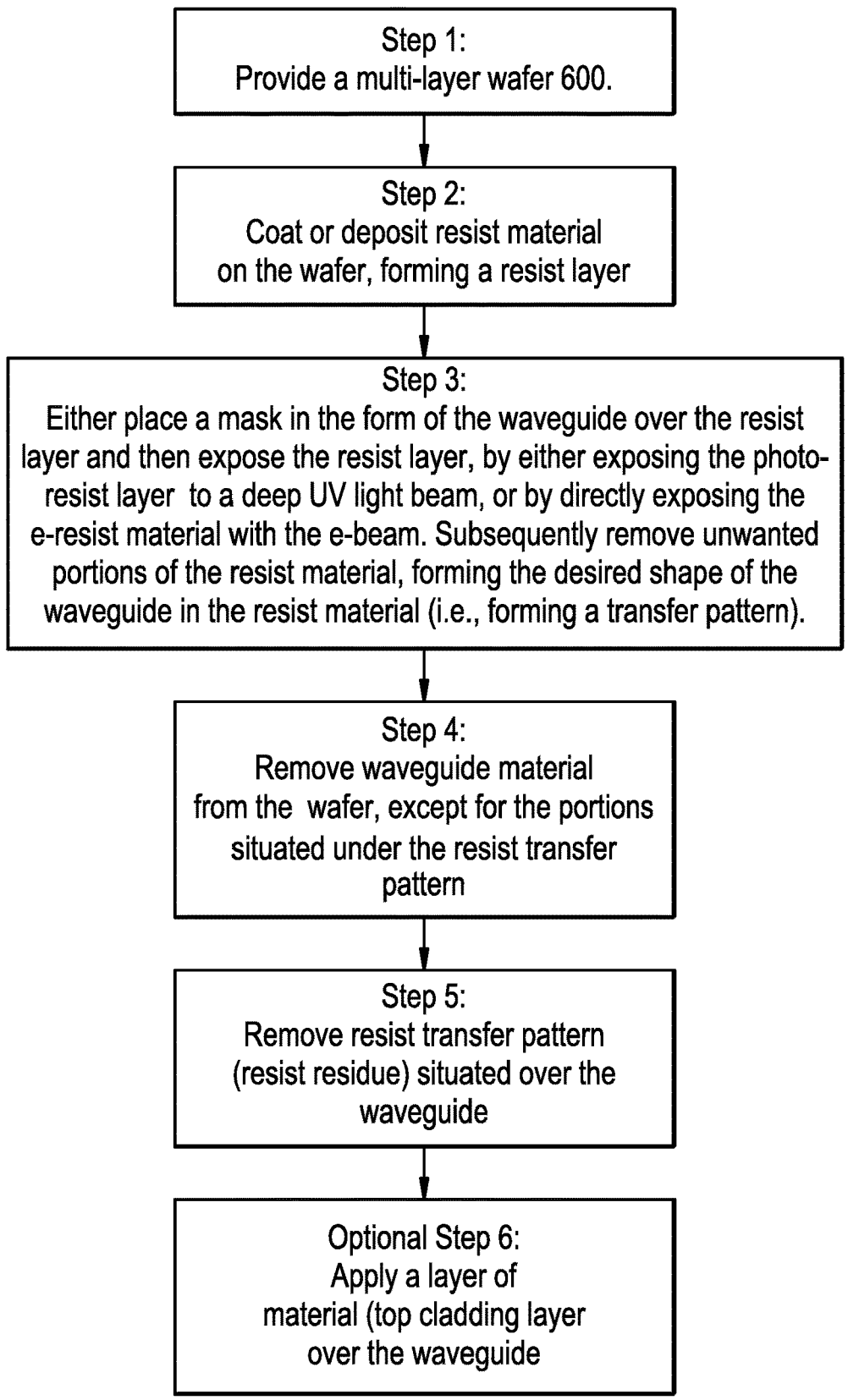
FIGS. 7A-B illustrate one exemplary embodiment of a process (process 1) for the fabrication the waveguides of FIGS. 1A, 1B, and 2.
Figure 7B:
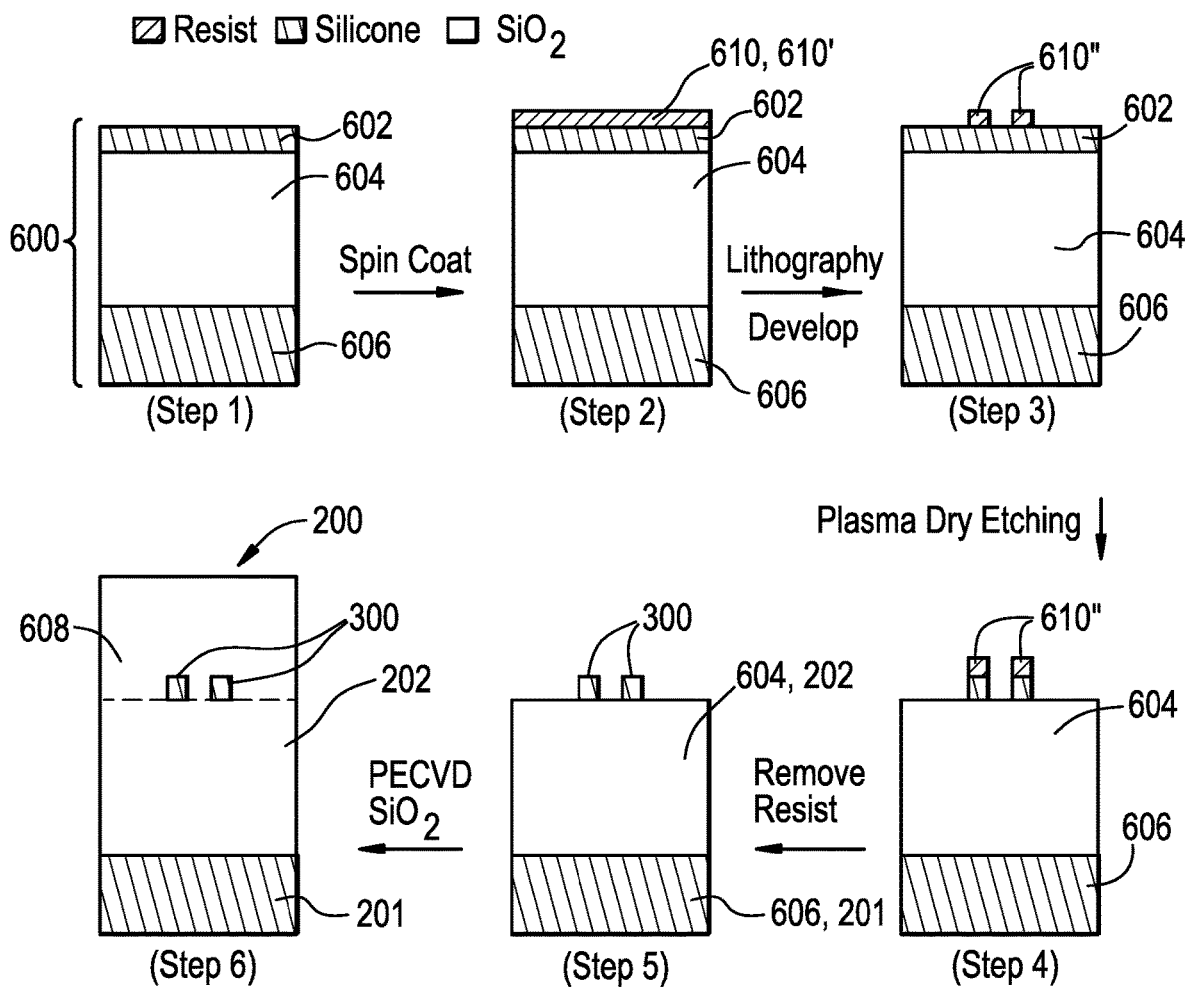

First Process (Process 1, Shown in FIG. 7A, 7B).

Summary of the first process:

During the first process, the resist material is spin-coated onto the wafer 600 (e.g., a SOI wafer), or otherwise deposited onto the wafer. The resist material is either photo-resist compatible with the DUVL, or e-beam resist compatible with EBL. After exposure (e. g., by DUVL or EBL) and development, the pattern for the waveguide is transferred to the waveguide material layer (e.g., silicon layer), for example via plasma dry etching. The resist residue is then removed, for example by oxygen plasma cleaning. Finally, a top cladding layer of oxide (cladding material, e.g., SiO$_2$) may be deposited over the resultant waveguides 300 by plasma enhanced chemical vapor deposition (PECVD). The details of one embodiment of this process are described below.

First, during step 1, wafer 600 (e.g., SOI wafer) comprising three layers 602, 604, 606 is manufactured or provided for step 2 of the process. Layer 602 is made of waveguide material, layer 604 is referred to herein as an insulator layer, and layer 606 as the wafer substrate layer.

The insulator layer 604 may be, for example, silica-based glass (e.g., SiO$_2$). According to some embodiments, layers 602 and 606 are silicon layers. According to other embodiments at least one of the layers 602 and 606 is silicon nitride. According to some embodiments one of the layers 602 or 606 may be silicon, and the other layer may be silicon nitride.

During step 2 of this embodiment, the resist material 610' is spin-coated onto the wafer 600 (e.g., SOI wafer), producing a resist layer 610. The resist material 610' may be, for example, ZEP520A e-beam resist material, available from Zeon Corporation, or another resist material used in lithography processes (e. g., a DUV photo-resist). This type of resist material is considered to be a "positive tone resist material", i.e.—the resist material that is removed after exposure and development, and the unexposed areas remain.

Step 3 can be performed by either DUVL or EBL.

If EBL is used in step 3, only the resist areas that need to be removed are exposed to the e-beam and then developed by an e-beam compatible developer to remove the unwanted sections of the resist material and to form a resist transfer pattern 610". The resulting resist transfer pattern 610" is in the shape of the waveguide 300.

If DUVL is used in step 3, a photo-lithographic development process is applied to the resist layer 610 to form a resist layer transfer pattern 610". For example, after exposure of the resist layer 610 to the deep UV beam and development of resist material with the DUVL compatible developer, the desired pattern is transferred from the mask onto to the resist layer 610 forming the shape of the waveguide 300 in the resist material (i.e., forming the resist transfer pattern 610" in the shape of the waveguide 300). That is, the unwanted portions of the resist material are removed, and the remaining resist material has the shape of the waveguide 300.

Step 3 is followed by step 4 which comprises removing of waveguide material from the wafer, except for the portions situated under the resist transfer pattern 610", and thus forming the waveguide 300. For example, dry plasma etching (step 4) is utilized to etch and remove (etch out) the layer 602, except for the portions 602' of layer 602 that were situated under the resist transfer pattern 610", thus forming a waveguide 300 that is situated under the transfer pattern 610" and over the layer insulator 604 (which corresponds to the layer 202 of the spot size converter 200). The insulator layer 604 has a dielectric constant ($D_k$) of less than 4, preferably less than 3, for example 1.5 to 2.5, or 1 to 2.5. The insulator layer 604 may be, for example, pure $SiO_2$ glass, or another glass (e.g., lithium potassium borosilicate).

In step 5, the resist residue (resist pattern 610" situated over portion(s) 602') is then removed (e.g., by oxygen plasma cleaning) exposing the waveguide 300 situated over the insulator layer 604. Such a waveguide and spot size converter comprising this waveguide is shown, for example, in FIG. 1B.

Finally (and optionally), in step 6, a top cladding layer 608 of oxide (e.g. silicon oxide ($SiO_2$)) or a similar cladding material is deposited over the resultant silicon waveguide 300, for example by PECVD (plasma enhanced chemical vapor deposition), resulting in a waveguide 300 covered by the layer 202, as shown in FIG. 1A.

Figure 7C:
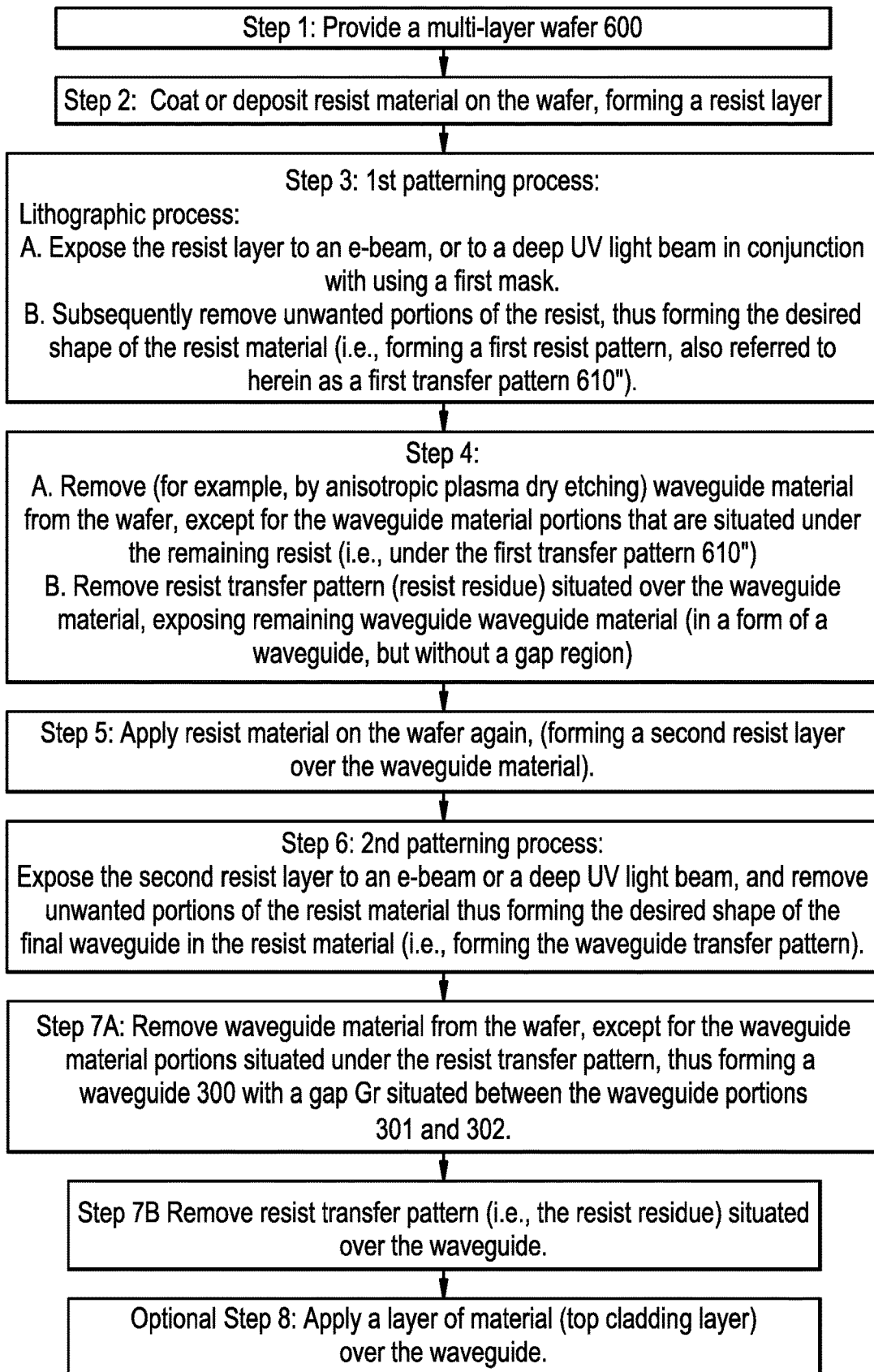
FIGS. 7C-7E illustrate another exemplary embodiment of a process (process 2) for the fabrication the waveguides of FIGS. 1A, 1B, and 2.
Figure 7D:
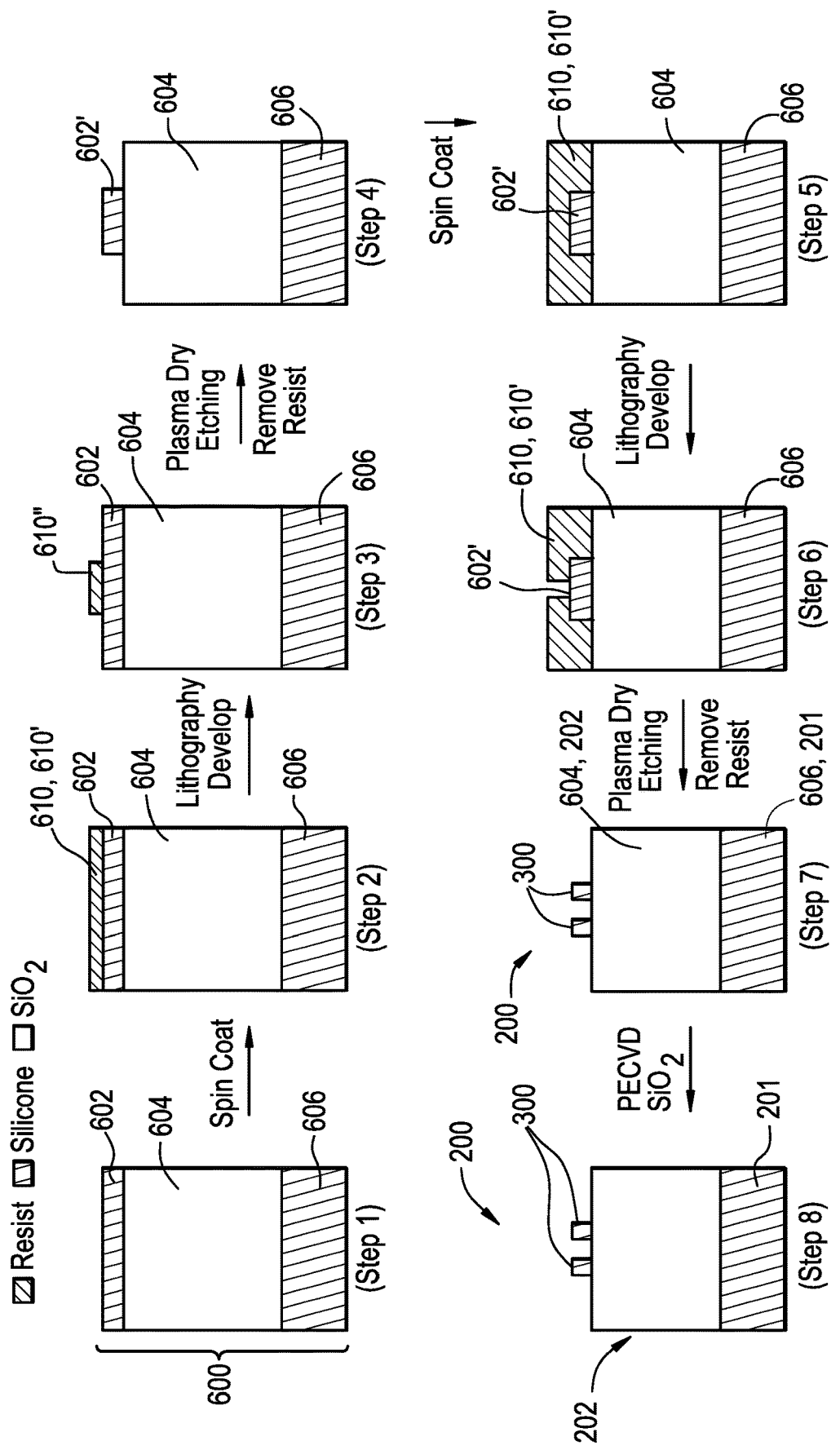
Figure 7E:
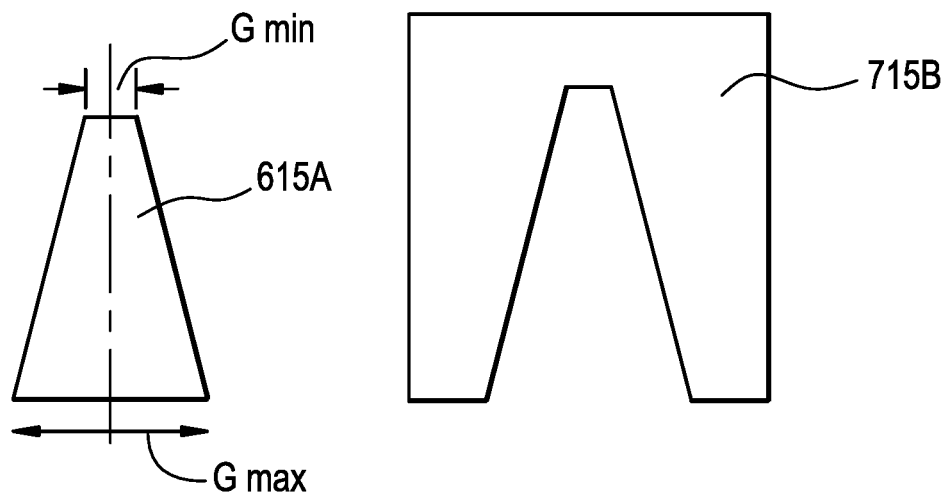

Second Process (Process 2, Illustrated in FIGS. 7C-E).

Summary of the second process: Process 2 is a two-step patterning process. During this process, the photo-resist or e-beam resist material is spin-coated onto the wafer 600 (e.g., SOI wafer) and exposed, for example, to deep UV beam or a e-beam via DUVL or EBL process. After development of the resist material, the waveguide pattern (e.g., strip waveguide pattern) is transferred to the waveguide material layer 602 (e.g., silicon layer), for example via anisotropic plasma dry etching. After removing the resist residue, a new layer of resist is spin-coated on the wafer again. The waveguide inner waveguide taper between waveguide portions 301 and 302 (i.e., the gap region Gr) is patterned by second DUVL or EBL. If DUVL process is utilized, patterning of the waveguide region between waveguide portions 301 and 302 is performed in conjunction with high-precision mask alignment. Subsequently, the taper structures of the waveguide portions 301, 302 are formed (e.g., by silicon dry etching). Finally, a top cladding layer of oxide (e.g., $SiO_2$ or another glass) may be deposited over the silicon waveguides by plasma enhanced chemical vapor deposition (PECVD). The details of one exemplary embodiment of this process are described below.

More specifically, during step 1, a wafer 600 (e.g., silicon-on-insulator wafer, SOI) comprising three layers 602, 604, 606 is manufactured or provided for the step 2 of exemplary process 2. The insulator layer 604 may be, for example, silica-based glass (e.g., $SiO_2$). According to some embodiments, one of the layers 602, 606 may be silicon, and the other layer may be silicon nitride.

During step 2, the resist material 610' is spin-coated onto the wafer 600 (e.g., SOI), producing a resist layer 610. The resist material 610' may be, for example, ZEP520A material, available from Zeon Corporation, or another appropriate resist material.

The waveguides 300 are then created via a two-step patterning process. During a first patterning step (step 3 of the second process), an initial waveguide shape is created in the resist material by a lithographic process. Step 3 of process 2 can be performed by DUVL or EBL.

If EBL is used in step 3, only the resist areas that need to be removed are first exposed to the e-beam and then developed by an e-beam compatible developer in order to remove the unwanted sections of the resist material and to form a first resist transfer pattern 610"A (also referred to herein as a partial waveguide pattern) on layer 602.

If DUVL is used in step 3, a photo-lithographic development process is applied to the resist layer 610 to form a first resist layer transfer pattern 610"A. A first mask is placed over the resist layer and after exposure of the resist layer 610 to a deep UV beam and development of resist material with the DUVL compatible developer, the unwanted portions of the resist material are removed and the desired pattern for the waveguide (partial waveguide pattern) is transferred from the mask onto to the resist layer 610, forming the initial shape of the waveguide 300 in the resist material (i.e., forming the resist transfer pattern 610"A).

Step 3 is then followed by step 4. Step 4 comprises removal of waveguide material from the wafer, except for the portions of the waveguide material situated under the resist transfer pattern 610". More specifically, Step 4 is utilized to etch and remove the material of layer 602, except for the portions 602' of layer 602 that were situated under the resist pattern 610", to form the initial waveguide. Step 4 may be, for example, an anisotropic plasma dry etching step.

After step 4, the resist residue (i.e., left over resist pattern 610"A situated over portion(s) 602') can be optionally removed, for example by oxygen plasma cleaning.

It is noted that in the process 2 embodiment, after the step 3 is performed, the resultant resist pattern 610" (the partial waveguide pattern) does not include the gap region that corresponds to the gap region Gr of the waveguide 300. Accordingly, the portion 602' of the waveguide material layer 602 that was situated under the resist pattern 610" forms an initial waveguide that does not include the internal gap Gr situated between the two waveguide portions.

During step 5 of the exemplary process 2 illustrated in FIG. 7D the resist material 610' is again applied (e.g., spin-coated) over the portion 602' and over the exposed portions of layer 604, producing a second resist layer 610. The resist material 610' for the second resist layer 610 may be, for example, ZEP520A material, available from Zeon Corporation, or another appropriate resist material. This resist material may be, for example, a positive resist material described above or a "negative tone resist material", for example, ma-N 2400, available from MicroChem Corporation. A negative tone resist material remains on the surface of the substrate where it is exposed, and the developer solution removes only the unexposed areas.

The taper of the waveguide portions 301, 302 and the gap region Gr inside the waveguide 300 are then patterned inside the initial waveguide by a second patterning step. The second patterning (Step 6 of process 2) can be performed by either DUV1 or EBL.

If EBL is used in step 6, with high-precision alignment of the e-beam, only the resist areas that need to be removed are exposed to the e-beam and then developed by an e-beam compatible developer to remove the unwanted sections of the resist material and to form a resist transfer pattern 610". In this embodiment layer 602 material corresponding in shape to the shape of the gap Gr is removed from the portion 602' of the waveguide material layer 602.

Alternatively, the resist material can be a negative tone photo-lithographic resist material (NR), and the second photo-lithographic step (step 6 of process 2) can be performed in conjunction with the with high-precision alignment of the mask 615A, shown schematically in FIG. 7E. For example, in step 6 of process 2 the mask 615A is situated over the portion of second resist layer 610 (negative tone resist material layer) located over the portion 602'. Then, the negative tone resist layer 610 not covered by the mask is irradiated by a UV light beam (e.g., deep UV beam with a wavelength about 248 nm or less, for example at a wavelength of 150 nm$\leq\lambda\leq$197 nm). Because the photo-lithographic developer removes only the unexposed areas of the negative tone resist material, and the mask 615A prevents a portion of the resist area being exposed to the deep UV radiation, the developer then removes the trapezoidal section of the negative resist material (because it is situated under the mask), to form a trapezoidal gap pattern in the shape of the gap region Gr in the negative resist material.

The waveguide material (e.g., silicon) that was situated under the gap portion of the mask 615 is then etched in step 7 of this process. This results in formation of the gap region Gr within the waveguide 300 and the separated waveguide portions 301, 302. That is, the resultant internal portion of the waveguide 300 is patterned by waveguide material etching (e.g., removal of silicon) between the waveguide portions 301 and 302. The mask 615A is tapered (e.g., trapezoidal)—i.e., it has a tapered width. The shape of the mask 615A corresponds the to the shape of the gap region Gr. The mask's feature at the small side of the mask that corresponds the to the small side of the gap region is for example, about 100 nm (and can range from eater than 90-100 nm to about 150 nm. (This corresponding to the gap width Gmin). The large side of the mask is preferably larger than 400 nm. That is, mask 615A (second mask) has a tapered width, with a minimum width Gmin between 90 nm and 150 nm and a maximum width between 350 nm and 450 nm (corresponding to the maximum gap region width Gmax). Therefore, minimum gap width Gmin between the two waveguide portions 301, 302 of the waveguide 300 of about 90-100 nm, which corresponds corresponding the minimum feature size of the mask 615A can be achieved with a standard industrial (lower resolution) CMOS DUVL process, and this can result, for example, in tip widths of less than 90 nm.

More specifically, in the embodiment shown in FIGS. 7E and 7D, dry plasma etching step (step 7, part A) is utilized to etch out and remove the waveguide material layer 602, except for the portions 602' corresponding to the waveguide 300. In step 7 (part B), the resist residue (left over resist pattern 610" situated over portion(s) 602') is then removed (for example, by oxygen plasma cleaning) forming a waveguide 300 situated over the layer 604. It is noted that the layer 604 will correspond to the layer 202 of the spot size converter 200. Such a spot size converter is shown, for example, in FIG. 1B. Finally (and optionally), in step 8, a top cladding layer 608 of silicon dioxide ($SiO_2$) is deposited over the resultant silicon waveguides by PECVD (plasma enhanced chemical vapor deposition), resulting in a waveguide 300 covered by the layer 202, as shown in FIG. 1A. Using a second (negative tone) resist material layer in conjunction with mask 615A can result in a waveguide 300 with tip widths W1min, W2min of 100 nm or less, for example 20 nm to 90 nm, 10 nm to 90 nm, or 20 nm to 60 nm.

Alternatively, during step 6 of process 2, the second resist material can be a positive resist material (PR) and the second photo-lithographic step (step 6 of process 2) can be performed in conjunction with the mask 615B, shown schematically in FIG. 7E. The mask 615B contains a trapezoidal shape gap. After the mask 615B is situated over the portion of second (positive) resist layer 610 located over the portion 602', the positive resist layer 610 not situated under the gap section of the mask 615B is irradiated by a UV light beam (e.g., deep UV beam with a wavelength about 248 nm or less). As noted above, the positive tone resist material is the resist material that is removed after exposure and development, and the unexposed areas remain. Thus, the lithographic process is applied to the positive resist layer 610 to remove a trapezoidal pattern in the shape of the gap region Gr from the positive tone resist material. Then the waveguide material (e.g., silicon) situated under the removed resist material is etched. This results in formation of the gap region Gr situated within the waveguide 300 and in the separated waveguide portions 301, 302. That is, the resultant internal portion of the waveguide 300 is patterned by waveguide material etching (e.g., removal of silicon) between the waveguide portions 301 and 302. Using a second (positive tone) resist material layer in conjunction with mask 615B can result in a waveguide 300 with tip width of 90 nm to 100 nm, or larger. Smaller waveguide tip widths can be achieved, for example, by using a negative resist layer with the mask 615A, as described above.

To summarize, the first process (process 1) directly patterns the double tip of the waveguide 300 using a single-step (Si) etching. To achieve a narrow tip width W1min, W2min below 90 or 100 nm (e.g., 70 nm, 50 nm, or 40 nm) with the first process, very high lithography resolution is required. Thus, the first process should use EBL to achieve such a small tip width.

Figure 8:
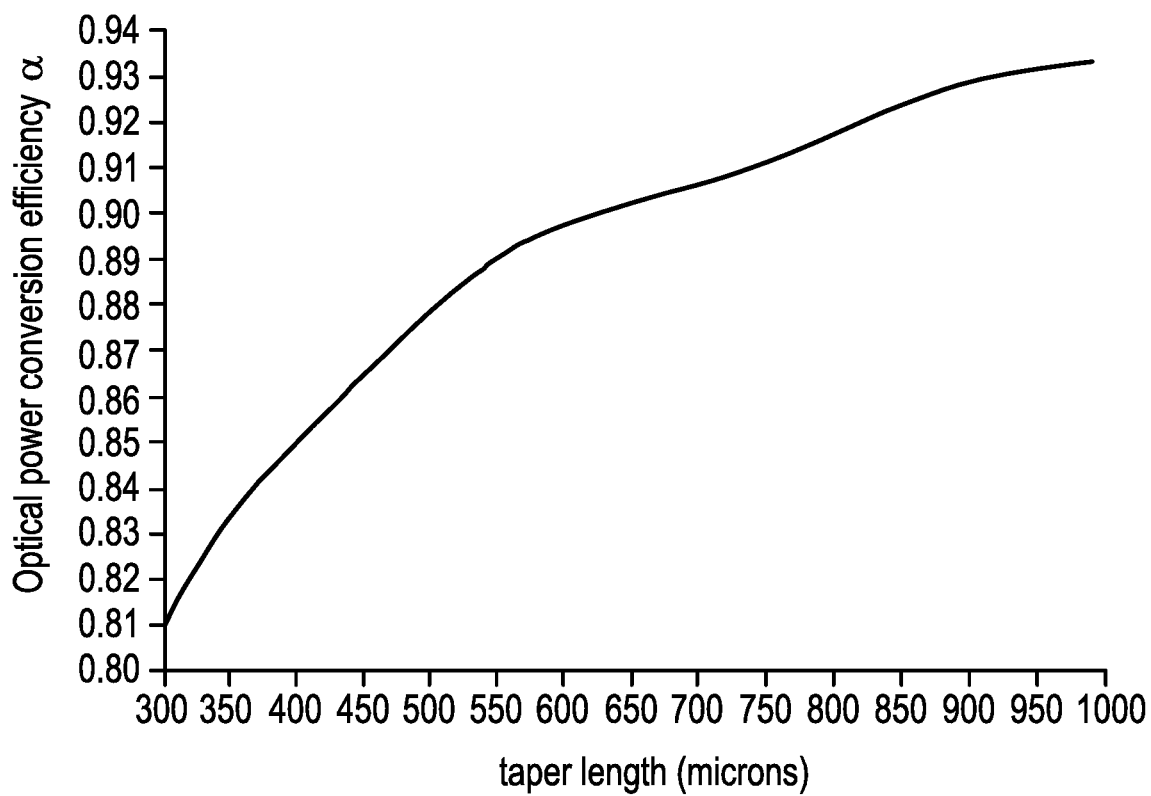
FIG. 8 shows the computed optical power conversion efficiency of the waveguide of FIG. 2.

However, in the second process embodiment (process 2, the process utilizing two-step etching), the double-tip configuration of the multi-tip waveguide 300 is created (patterned) by creating the tapered gap region via a second (Si) etching step, where the minimum size of the tapered mask 615A is about 90-100 nm, or greater. Therefore, it is more preferable (and less expensive) to employ the second process for mass production of spot size converters 200 by using the standard industrial CMOS 193-nm DUVL with minimum feature size of the mask 615A ranging from about 90 or 100 nm to about 150 nm. (The minimum feature size of the mask 615 corresponds to the minimum gap width Gmin.). This allows one to achieve a narrow tip width W1min, W2min below 90 or 100 nm (e.g., 80 nm, 75 nm, 70 nm, 60 nm, 50 nm, 45 nm, 40 nm, 30 nm, 20 nm, or 10 nm to 50 nm, or 20 nm to 50 nm) without the use of very high lithography resolution, or without having to use EBL FIG. 8 illustrates the computed optical power conversion efficiency of an exemplary embodiment of a double-tip SSC (spot size converter) waveguide 300 at a 1550 nm transmission wavelength. The double-tip SSC (spot size converter) waveguide 300 comprised of a 220 nm deep by 500 nm wide Si (silicon) waveguide portion 303 and two waveguide portions 301, 302. In this embodiment, waveguide portions 301 and 302 are tapered, and each waveguide portion 301, 302 has a tip that is 220 nm deep and 90 nm wide, resulting in a 320 nm separation (Gmax) between the waveguide tips. In this embodiment the Si waveguide 300 is situated on a low refractive index (1.44-1.46) buried oxide layer and is covered by a low temperature silicon oxide with a similar index deposited on top. The initial width (Gmin) of the tapered gap is 100 nm. FIG. 8 illustrates that optical power conversion efficiency (also referred to herein as coupling efficiency a) of greater than 0.9 (i.e., loss smaller than ~0.5 dB) can be achieved with lengths Lt of greater than 600 microns. Thus, the design of waveguide 300 allows realization of an efficient and compact mode convertor (spot size converter 200) with smallest feature size corresponding to Gmin of about 100 nm, which is well within current capabilities of the DUVL CMOS process. Accordingly, spot size converter 200 can be advantageously manufactured by the Process 2 embodiment.

Optionally, in one embodiment, when the width W4 of the optical waveguide 500 is 500 nm and the thickness H4 of the optical waveguide 500 is H4=220 nm, values of the parameters waveguide 300 of the of the spot size converter 200 may be as shown in Table 1.

TABLE 1

| Parameter | | | |
|---|---|---|---|
| H1 | Gmin | H3 | Gmax |
| 200-225 nm | 100-150 nm | 10 μm | 300-480 μm |

| Parameter | | | |
|---|---|---|---|
| L1 | L2 | W1min | W2min |
| 600-2000 μm | 600-1000 μm | 20-100 nm | 20-100 nm |

(First row label: Value, repeated for second sub-table: Value)

In Table 1 embodiment a spot size converter 200 includes the waveguide 300 with a first waveguide portion 301, a second waveguide portion 302, and a third waveguide portion 303. The spot size converter 200 of Table 1 can be used to implement spot size conversion between an optical fiber 400 and an optical waveguide 300, and the coupling loss between the optical fiber 400 and the optical waveguide 300 can be reduced by using the spot size converter 200.

For example, if the spot size converter 200 shown in FIG. 1A or 1B is disposed between the optical fiber 400 and the optical waveguide 500, an optical signal output from the optical fiber 400 may be coupled to the spot size converter 200. There is an optical field distributed between the first waveguide portion 301 and the second waveguide portion 302. Then, the optical signal may be coupled to the third waveguide portion 303, and further coupled to the rear optical waveguide 500, as shown in FIG. 4.

Optionally, for example, the parameters of the spot size converter use the values shown in Table 1. The outer diameter of the SMF-28® exemplary single-mode optical fiber 400 is about 125 μm, and its core diameter is about 8.2 μm. The mode field (normalized mode profile) of an optical signal output from the optical fiber 400 is shown in FIG. 6 and can be understood as the mode field of an input optical signal of the spot size converter 200. The spot diameter of the mode field is approximately 10 μm (i.e., the MFD provided by the waveguide 300 of this embodiment is about 10 μm). Thus, there is a relatively large alignment tolerance when using a single mode fiber with this spot size converter 200 provided in this embodiment. Accordingly, the requirement of alignment between the optical fiber 400 and the spot size converter 200 can be greatly relaxed by using the spot size converter 200 provided in this embodiment instead of a conventional spot size converter.

It may be understood that in the foregoing embodiment, the waveguide 300 in the spot size converter 200 is symmetrical or substantially symmetrical in structure, and a symmetry plane is a plane perpendicular to a width direction, or the symmetry plane may be understood as a y-z plane.

It will be apparent to those skilled in the art that various modifications and variations can be made without departing from the spirit or scope of the invention. Since modifications combinations, sub-combinations and variations of the disclosed embodiments incorporating the spirit and substance of the invention may occur to persons skilled in the art, the invention should be construed to include everything within the scope of the appended claims and their equivalents.

What is claimed is:

1. A method of making a spot size converter comprising a multi-tip waveguide comprising a first and a second waveguide portions separated by a tapered gap region Gr, the method comprising the steps of:

(a) coating a multilayer wafer comprising a waveguide material layer with a photo-resist material or an electron beam resist material;
(b) exposing the coated resist material to a deep UV beam or an electron beam;
(c) developing the coated resist material to form at least a partial waveguide pattern within the resist material;
(d) transferring the partial waveguide pattern to the waveguide material layer to form an initial waveguide;
(e) placing a second layer of resist material over the initial waveguide;
(f) patterning a tapered gap region shape in the second layer of the resist material, by exposing the second layer of resist material to a deep UV beam or an electron beam; and
(g) transferring the tapered gap region shape to the waveguide material layer of the initial waveguide to form the tapered gap region Gr inside the initial waveguide, thereby forming a multi-tip waveguide with the first and the second waveguide portions separated by the gap region Gr, wherein a full thickness of the multi-tip waveguide is configured to be exposed at end faces of the first and second waveguide portions.

2. The method of making a spot size converter of claim 1, wherein
(i) the step of transferring the partial waveguide pattern to the waveguide material layer comprises etching; and
(ii) the step of transferring the tapered gap region shape to the waveguide material layer comprises etching.

3. The method of making a spot size converter of claim 1, wherein the gap region Gr has a minimum width Gmin between 50 nm and 150 nm and a maximum width Gmax between 300 nm and 480 nm.

4. The method of making a spot size converter of claim 1, wherein the gap region Gr has a minimum width Gmin between 90 nm and 150 nm and a maximum width Gmax between 300 nm and 480 nm.

5. The method of making a spot size converter of claim 1, wherein the gap region Gr has a minimum width Gmin between 90 nm and 150 nm and a maximum width Gmax between 350 nm and 450 nm.

6. The method of making a spot size converter according to claim 1, and further comprising the step of depositing a top cladding layer over the multi-tip waveguide.

7. The method of making a spot size converter according to claim 1 wherein:
the steps (i) of developing the partial waveguide pattern within the photo-resist material and of transferring the partial waveguide pattern to waveguide material are performed via anisotropic plasma dry etching.

8. The method of making a spot size converter of claim 7 further comprising:
depositing a top cladding layer of oxide over the waveguide by plasma enhanced chemical vapor deposition (PECVD).

9. A spot size converter made by a method of claim 1.

10. The spot size converter of claim 9, wherein said multi-tip waveguide comprises two tips and wherein:
the length of the waveguide is L1, the lengths of the first waveguide portion and the second waveguide portion are L2,
the thickness H1 of the multi-tip waveguide is substantially constant,
the minimum widths of the first waveguide portion and the second waveguide portion are W1 min and W2 min, and wherein 0 µm<$L1$≤500 µm; 0 µm<$L3$≤200 µm;

0 µm<$H1$≤400 nm; and 50 nm<$W1$ min≤100 nm; 50 nm<$W2$ min≤100 nm.

11. A method of making a spot size converter comprising a multi-tip waveguide comprising a first and a second waveguide portions separated by a tapered gap region Gr, the method comprising the steps of:
   (a) coating a multilayer wafer with a photo-resist material;
   (b) exposing the coated photo-resist material to a deep UV beam through a first mask;
   (c) developing the photo-resist material to form a partial waveguide pattern within the photo-resist material;
   (d) transferring the partial waveguide pattern to a waveguide material layer of the wafer to form an initial waveguide;
   (e) placing a second layer of photo-resist material over the initial waveguide;
   (f) patterning a tapered gap region shape in the second layer of the photo-resist material by exposing the second layer of the photo-resist material to a deep UV beam with the second mask situated over the second slayer of photo-resist material; and
   (g) utilizing the tapered gap region shape in the second layer of the photo-resist material to form the tapered gap region Gr inside the initial waveguide, thereby forming a multi-tip waveguide with the first and the second waveguide portions separated by the gap region Gr, wherein a full thickness of the multi-tip waveguide is configured to be exposed at end faces of the first and second waveguide portions.

12. The method of making a spot size converter according to claim 11, further comprising the step of depositing a top cladding layer over the multi-tip waveguide.

13. The method of making a spot size converter according to claim 11 wherein:
   the steps (i) of developing the partial waveguide pattern within the photo-resist material and of transferring the partial waveguide pattern to waveguide material are performed via anisotropic plasma dry etching.

14. The method of making a spot size converter of claim 13, further comprising: depositing a top cladding layer of oxide over the waveguide by plasma enhanced chemical vapor deposition (PECVD).

15. A method of making a spot size converter comprising the steps of:
   (A) depositing a photo-resist material on a multilayer wafer and forming a first resist layer on the multilayer wafer;
   (B) patterning the photo-resist material of the first resist layer to create a first transfer pattern by:
      (a) placing a first mask over the first resist layer and then exposing the first resist layer to an a deep UV light beam;
      (b) subsequently removing unwanted portions of the photo-resist material that were exposed to a deep UV light, thereby forming a desired shape in the photo-resist material and creating the first transfer pattern;
   (C) removing waveguide material from the multilayer wafer, except for the waveguide material portions that are situated under under the first transfer pattern, to form an initial waveguide;
   (D) applying a second layer of photo-resist material over the initial waveguide;
   (E) patterning the second layer of the photo-resist material to create a second transfer pattern by exposing the second layer of the photo-resist material to a deep UV light beam while masking a portion of the second resist layer with a second mask; and
   (F) utilizing the second transfer pattern to form a tapered gap region Gr inside the initial waveguide by removing unwanted portions of the waveguide material from the initial waveguide, thereby forming a multi-tip waveguide, said waveguide comprising a first and a second waveguide portions separated by the tapered gap region Gr, wherein a full thickness of the multi-tip waveguide is configured to be exposed at end faces of the first and second waveguide portions.

16. The method of making a spot size converter of claim 15, wherein the second mask is tapered.

17. The method of making a spot size converter of claim 15, wherein the second mask is trapezoidal.

18. The method of making a spot size converter of claim 15 further comprising the step of: applying a cladding material over the waveguide, wherein the cladding material has an index of refraction that is less than the index of refraction of the material forming the multi-tip waveguide.

19. The method of making a spot size converter of claim 15 wherein the cladding material has an index of refraction that is less than the index of refraction of the material forming the multi-tip waveguide, and Δ% of the waveguide material relative to the cladding material is greater than 25%.

20. The method of making a spot size converter of claim 15, wherein the cladding material has an index of refraction that is less than the index of refraction of the material forming the multi-tip waveguide, and Δ% of the waveguide material relative to the cladding material is greater than 50%.

21. The method of making a spot size converter of claim 15, wherein said second mask has a tapered width, with a minimum width Gmin between 90 nm and 150 nm and a maximum width Gmax between 350 nm and 450 nm.

22. The method of making a spot size converter of claim 15 further comprising: depositing a top cladding layer of oxide over the waveguide by plasma enhanced chemical vapor deposition (PECVD).

* * * * *